United States Patent
Shih

(10) Patent No.: US 12,354,965 B2
(45) Date of Patent: Jul. 8, 2025

(54) SEMICONDUCTOR DEVICE WITH REDISTRIBUTION STRUCTURE AND METHOD FOR FABRICATING THE SAME

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 491 days.

(21) Appl. No.: 17/983,569

(22) Filed: Nov. 9, 2022

(65) Prior Publication Data

US 2024/0153878 A1 May 9, 2024

(51) Int. Cl.
*H01L 23/538* (2006.01)
*H01L 21/48* (2006.01)
(Continued)

(52) U.S. Cl.
CPC ........ *H01L 23/5381* (2013.01); *H01L 21/486* (2013.01); *H01L 23/5385* (2013.01);
(Continued)

(58) Field of Classification Search
CPC ............... H01L 23/5381; H01L 21/486; H01L 23/5385; H01L 23/5386; H01L 24/08; H01L 25/105; H01L 24/80; H01L 24/16; H01L 24/32; H01L 2224/08235; H01L 2224/16235; H01L 2224/73204; H01L 2224/80895
See application file for complete search history.

(56) References Cited

U.S. PATENT DOCUMENTS 11,791,233 B1 * 10/2023 Mathuriya .......... H01L 25/0652
257/295
12,243,797 B1 * 3/2025 Mathuriya .......... G06F 15/7825
(Continued)

FOREIGN PATENT DOCUMENTS

| CN | 111883519 A | 11/2020 |
|---|---|---|
| TW | 202105652 A | 2/2021 |
| TW | 202123338 A | 6/2021 |

*Primary Examiner* — Thanh Y. Tran
(74) *Attorney, Agent, or Firm* — MUNCY, GEISSLER, OLDS & LOWE, P.C.

(57) ABSTRACT

The present application provides a semiconductor device and a method for fabricating the semiconductor device. The semiconductor device includes a first die; a first redistribution structure positioned on the first die; a second die positioned on the first redistribution structure and comprising a first cache unit; and a third die positioned on the first redistribution structure, separated from the second die, and comprising a second cache unit. The first redistribution structure comprises: a plurality of conductive layers electrically coupled the first die and the first cache unit of the second die and electrically coupled the first die and the second cache unit of the third die, respectively and correspondingly; and a bridge layer electrically isolated from the plurality of conductive layers, electrically connected the second die and the third die. The first cache unit of the second die and the second cache unit of the third die are topographically aligned with the first die. The first die is configured as a cache memory, and the second die and the third die are configured as logic dies.

20 Claims, 26 Drawing Sheets

(51) Int. Cl.
*H01L 23/00* (2006.01)
*H01L 25/10* (2006.01)

(52) U.S. Cl.
CPC .......... *H01L 23/5386* (2013.01); *H01L 24/08* (2013.01); *H01L 24/80* (2013.01); *H01L 25/105* (2013.01); H01L 24/16 (2013.01); H01L 24/32 (2013.01); H01L 24/73 (2013.01); H01L 2224/08235 (2013.01); H01L 2224/16235 (2013.01); H01L 2224/32225 (2013.01); H01L 2224/73204 (2013.01); H01L 2224/80895 (2013.01); H01L 2224/80896 (2013.01); H01L 2225/1023 (2013.01); H01L 2225/1041 (2013.01); H01L 2225/1058 (2013.01); H01L 2924/1431 (2013.01); H01L 2924/1434 (2013.01); H01L 2924/3512 (2013.01); H01L 2924/37001 (2013.01)

(56) References Cited

U.S. PATENT DOCUMENTS

| | | | |
|---|---|---|---|
| 12,288,750 B2* | 4/2025 | Lambert | H01L 23/5383 |
| 2021/0066185 A1 | 3/2021 | Lim et al. | |
| 2021/0134724 A1* | 5/2021 | Rubin | H01L 23/5385 |
| 2021/0375829 A1 | 12/2021 | Or-Bach et al. | |

* cited by examiner

SEMICONDUCTOR DEVICE WITH REDISTRIBUTION STRUCTURE AND METHOD FOR FABRICATING THE SAME

TECHNICAL FIELD

The present disclosure relates to a semiconductor device and a method for fabricating the semiconductor device, and more particularly, to a semiconductor device with a redistribution structure and a method for fabricating the semiconductor device with the redistribution structure.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first die; a first redistribution structure positioned on the first die; a second die positioned on the first redistribution structure and comprising a first cache unit; and a third die positioned on the first redistribution structure, separated from the second die, and comprising a second cache unit. The first redistribution structure comprises: a plurality of conductive layers electrically coupled the first die and the first cache unit of the second die and electrically coupled the first die and the second cache unit of the third die, respectively and correspondingly; and a bridge layer electrically isolated from the plurality of conductive layers, electrically connected the second die and the third die. The first cache unit of the second die and the second cache unit of the third die are topographically aligned with the first die. The first die is configured as a cache memory, and the second die and the third die are configured as logic dies.

Another aspect of the present disclosure provides a semiconductor device including a first die; a second die positioned over the first die and comprising a first cache unit; a third die positioned over the first die, horizontally separated from the second die, and comprising a second cache unit; a first redistribution structure positioned between the first die and the second die, between the first die and the third die, and comprising a plurality of conductive layers electrically coupled to the first die, and a bridge layer electrically isolated from the plurality of conductive layers; and a second redistribution structure positioned between the first redistribution structure and the second die, between the first redistribution structure and the third die, and comprising a plurality of conductive layers electrically coupled the bridge layer and the second die and electrically coupled the bridge layer and the third die, and a re-routing layer electrically coupled a corresponding one of the plurality of conductive layers of the first redistribution structure and the first cache unit of the second die. The first cache unit of the second die is not topographically aligned with the first die. The first die is configured as a cache memory, and the second die and the third die are configured as logic dies.

Another aspect of the present disclosure provides a method for fabricating a semiconductor device including providing a first die comprising a front surface and a back surface; forming a first redistribution structure on the front surface of the first die; providing a second die comprising a first cache unit; providing a third die comprising a second cache unit; and bonding the second die and the third die onto a front surface of the first redistribution structure. The first redistribution structure comprises: a plurality of conductive layers electrically coupled the first die and the first cache unit of the second die and electrically coupled the first die and the second cache unit of the third die, respectively and correspondingly; and a bridge layer electrically isolated from the plurality of conductive layers, and electrically connected the second die and the third die. The first cache unit of the second die and the second cache unit of the third die are topographically aligned with the first die. The first die is configured as a cache memory, and the second die and the third die are configured as logic dies.

Due to the design of the semiconductor device of the present disclosure, the second die and the third die may operate cooperatively by employing the plurality of bridge layers. In addition, the second die and the third die may still respectively or cooperatively access to the first die. As a result, the performance of the semiconductor device may be improved. Furthermore, small dies such as the first die, second die, and the third die may be fabricated with higher yield compared to manufacturing of large dies. Therefore, the overall yield of manufacturing the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
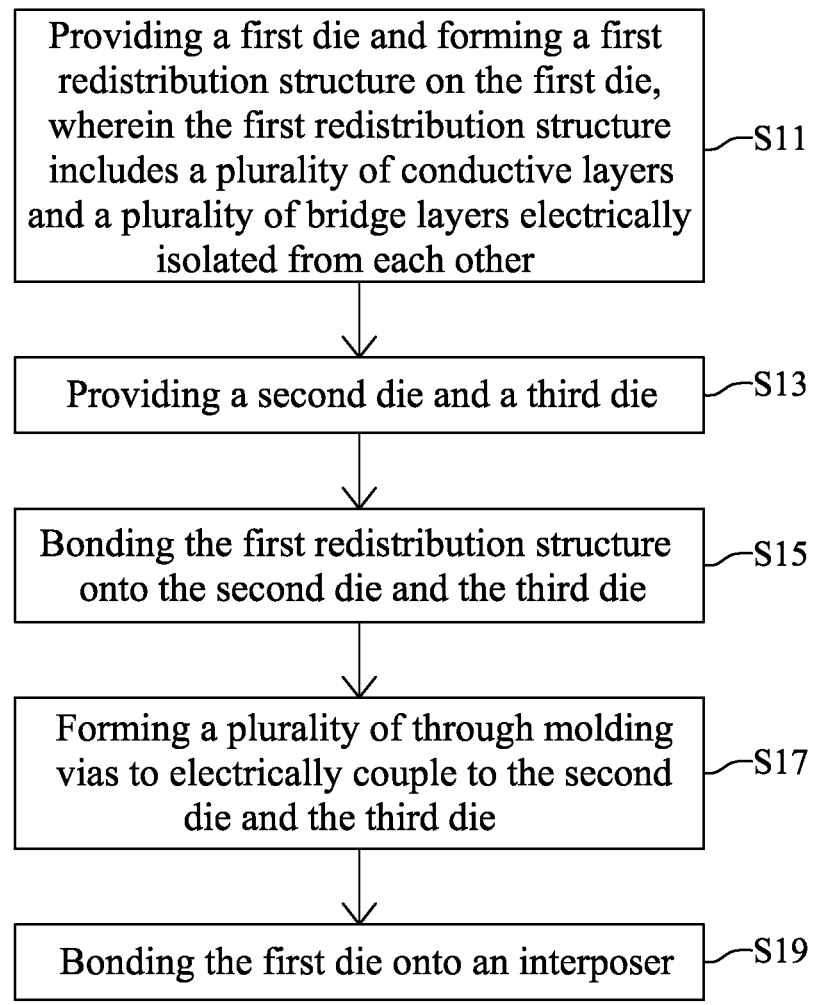
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

In the description of the present disclosure, an X-Y-Z coordinate system is assumed where X and Y refer to dimensions (directions) within the plane parallel to the major surface of the structure and Z refers a dimension (direction) perpendicular to the plane, two features are topographically aligned when those features have substantially the same X, Y coordinates.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

It should be noted that, in the description of the present disclosure, the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

Figure 18:
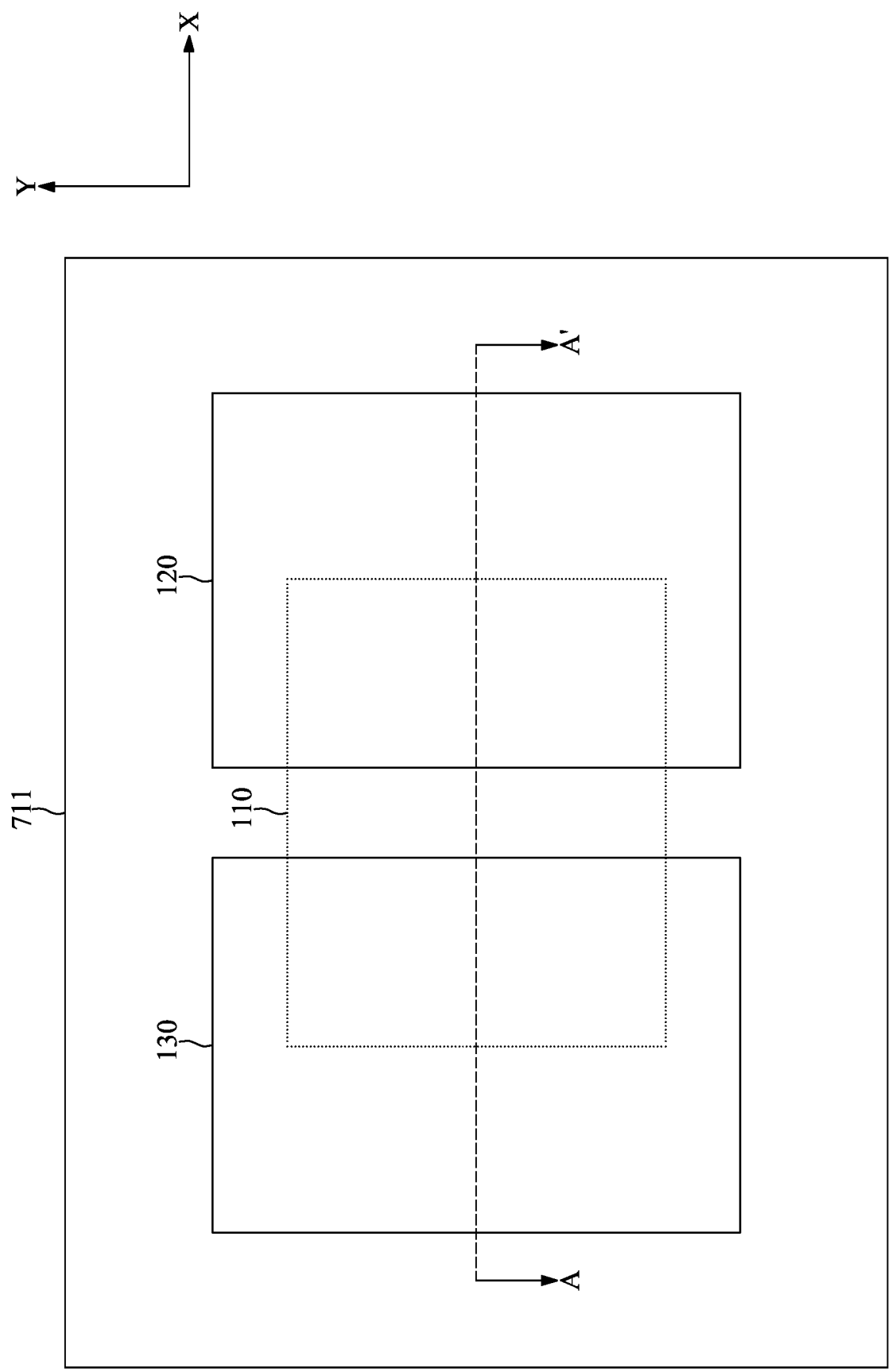
FIG. 18 illustrates, in a schematic top-view diagram, an intermediate semiconductor device in accordance with one embodiment of the present disclosure.
Figure 19:
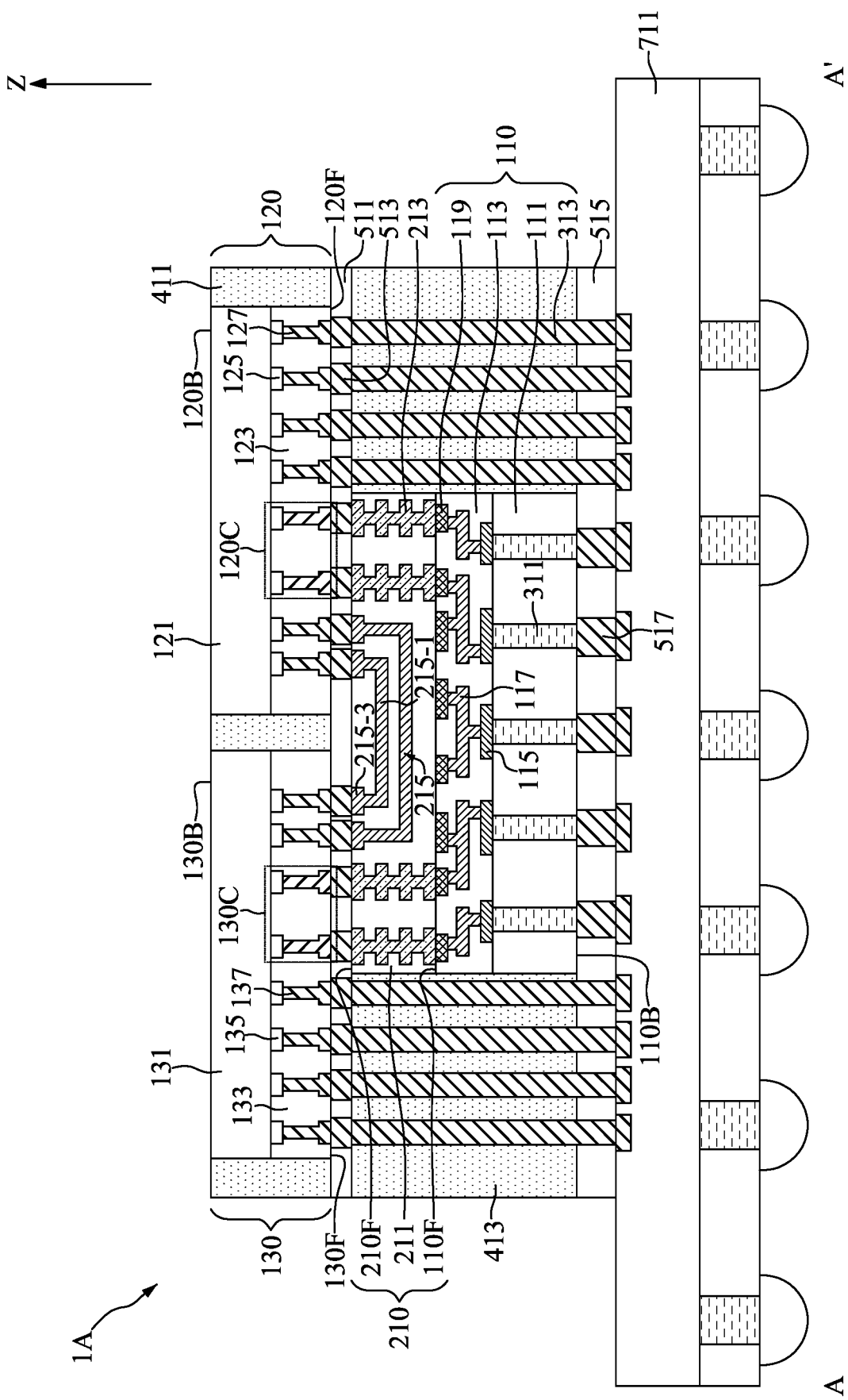
FIG. 19 is a schematic cross-sectional view diagram taken along a line A-A' in FIG. 18 illustrating part of the flow for fabricating the semiconductor device in accordance with one embodiment of the present disclosure.

FIG. 1 illustrates, in a flowchart diagram form, a method 10 for fabricating a semiconductor device 1A in accordance with one embodiment of the present disclosure. FIGS. 2 to 17 illustrate, in schematic cross-sectional view diagrams, part of a flow for fabricating the semiconductor device 1A in accordance with one embodiment of the present disclosure. FIG. 18 illustrates, in a schematic top-view diagram, an intermediate semiconductor device in accordance with one embodiment of the present disclosure. FIG. 19 is a schematic cross-sectional view diagram taken along a line A-A' in FIG. 18 illustrating part of the flow for fabricating the semiconductor device 1A in accordance with one embodiment of the present disclosure. It should be noted that some elements of the semiconductor device 1A may be simplified or omitted in top-view diagrams for clarity.

Figure 2:
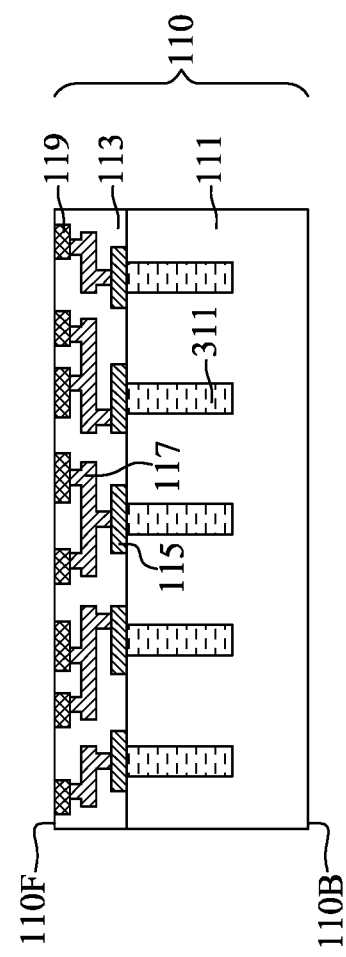
FIGS. 2 to 17 illustrate, in schematic cross-sectional view diagrams, part of a flow for fabricating the semiconductor device in accordance with one embodiment of the present disclosure.
Figure 3:
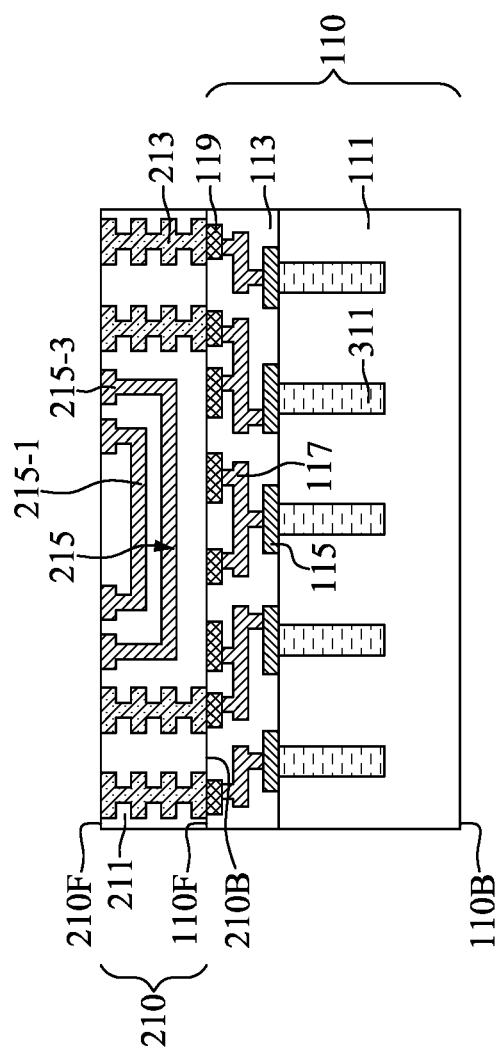

With reference to FIGS. 1 to 3, at step S11, a first die 110 may be provided and a first redistribution structure 210 may be formed on the first die 110, wherein the first redistribution structure 210 may include a plurality of conductive layers 213 and a plurality of bridge layers 215 electrically isolated from each other.

With reference to FIG. 2, the first die 110 may include a first substrate 111, a first dielectric layer 113, a plurality of first device elements 115, a plurality of first conductive layers 117, and a plurality of first conductive pads 119.

In some embodiments, the first substrate 111 may be a bulk semiconductor substrate. The bulk semiconductor substrate may be formed of, for example, an elementary semiconductor such as silicon or germanium, or a compound semiconductor such as silicon germanium, silicon carbide, gallium arsenide, gallium phosphide, indium phosphide, indium arsenide, indium antimonide, or other III-V compound semiconductor or II-VI compound semiconductor.

In some embodiments, the thickness of the first substrate 111 may be between about 500 µm and about 700 µm. For example, the thickness of the first substrate 111 may be about 600 µm.

It should be noted that, in the description of present disclosure, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

In some embodiments, the plurality of first device elements 115 may be formed on the first substrate 111. Some portions of the plurality of first device elements 115 may be formed in the first substrate 111. The plurality of first device elements 115 may be transistors such as complementary metal-oxide-semiconductor transistors, metal-oxide-semiconductor field-effect transistors, fin field-effect-transistors, the like, or a combination thereof.

In some embodiments, the first dielectric layer 113 may be formed on the first substrate 111. The first dielectric layer 113 may be a stacked layer structure. The first dielectric layer 113 may include a plurality of insulating sub-layers. Each of the insulating sub-layers may have a thickness between about 0.5 µm and about 3.0 µm. The insulating sub-layers may be formed of, for example, silicon oxide, borophosphosilicate glass, undoped silicate glass, fluorinated silicate glass, low-k dielectric materials, the like, or a combination thereof. The insulating sub-layers may be formed of different materials but are not limited thereto.

The low-k dielectric materials may have a dielectric constant less than 3.0 or even less than 2.5. In some embodiments, the low-k dielectric materials may have a dielectric constant less than 2.0. The insulating sub-layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

In some embodiments, the plurality of first conductive layers 117 may be formed in the first dielectric layer 113. The plurality of first conductive layers 117 may include a plurality of first conductive lines, a plurality of first conductive vias, and the plurality of first conductive pads 119. The first conductive lines may be separated from each other and may be horizontally disposed in the first dielectric layer 113 along the direction Z. In the present embodiment, the topmost first conductive lines may be designated as the plurality of first conductive pads 119. The top surfaces of the plurality of first conductive pads 119 and the top surface of the first dielectric layer 113 may be substantially coplanar. The first conductive vias may connect adjacent first conductive lines along the direction Z, adjacent first device element 115 and first conductive line, and adjacent first conductive pad 119 and first conductive line. In some embodiments, the plurality of first conductive layers 117 and the plurality of first conductive pads 119 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of first conductive layers 117 and the plurality of first conductive pads 119 may be formed during the formation of the first dielectric layer 113.

In some embodiments, the plurality of first device elements 115, the plurality of first conductive layers 117, and the plurality of first conductive pads 119 may together configure functional units of the first die 110. A functional unit, in the description of the present disclosure, generally refers to functionally related circuitry that has been partitioned for functional purposes into a distinct unit. In some embodiments, the functional units of the first die 110 may include, for example, highly complex circuits such as processor cores, memory controllers, accelerator units, or other applicable functional circuitry. In the present embodiments, the first die 110 may be configured as a cache memory.

It should be noted that, in the description of the present disclosure, the term "front" surface is a term of art implying the major surface of the structure upon which is formed device elements and conductive features. Likewise, the "back" surface of a structure is that major surface opposite to the face. For example, the top surface of the first dielectric layer 113 may be referred to as the front surface 110F of the first die 110. The bottom surface of the first substrate 111 may be referred to as the back surface 110B of the first die 110.

With reference to FIG. 2, a plurality of through substrate vias 311 may be formed in the first substrate 111. The plurality of through substrate vias 311 may be electrically coupled to the functional units of the first die 110. In some embodiments, the plurality of through substrate vias 311 may be formed of, for example, doped polysilicon, tungsten, copper, carbon nanotube, or solder alloy. In some embodiments, isolation layers (not shown for clarity) may be formed on the sidewalls of the plurality of through substrate vias 311 to electrically isolate the plurality of through substrate vias 311 form the first substrate 111. In some embodiments, the plurality of through substrate vias 311 may be formed by a via-middle process, a via-first process, or a via-last process.

With reference to FIG. 3, the first redistribution structure 210 may be formed on the front surface 110F of the first die 110. In some embodiments, the first redistribution structure 210 may include a first redistribution dielectric layer 211, the plurality of conductive layers 213, and the plurality of bridge layers 215.

With reference to FIG. 3, the first redistribution dielectric layer 211 may be formed on the first dielectric layer 113. The first redistribution dielectric layer 211 may be a stacked layer structure. The first redistribution dielectric layer 211 may include a plurality of insulating sub-layers. The insulating sub-layers may be formed of, for example, silicon oxide, borophosphosilicate glass, undoped silicate glass, fluorinated silicate glass, low-k dielectric materials, the like, or a combination thereof. The insulating sub-layers may be formed of different materials but are not limited thereto. The insulating sub-layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

In the present embodiments, the bottom surface of the first redistribution dielectric layer 211 (i.e., the surface faces toward the first dielectric layer 113) may be referred to as the back surface 210B of the first redistribution structure 210. Accordingly, the top surface of the first redistribution dielectric layer 211 may be referred to as the front surface 210F of the first redistribution structure 210.

With reference to FIG. 3, the plurality of conductive layers 213 may be formed in the first redistribution dielectric layer 211. The plurality of conductive layers 213 may be formed on corresponding first conductive pads 119 to electrically couple to the functional units of the first die 110. In some embodiments, the plurality of conductive layers 213 may include a plurality of conductive lines, a plurality of conductive vias, and a plurality of conductive pads (not separately labelled for clarity). The conductive lines may be separated from each other and may be horizontally disposed in the first redistribution dielectric layer 211 along the direction Z. In the present embodiment, the topmost conductive lines may be designated as the plurality of conductive pads. The top surfaces of the plurality of conductive pads and the top surface of the first redistribution dielectric layer 211 may be substantially coplanar. The conductive vias may connect adjacent conductive lines along the direction Z and adjacent conductive pad and conductive line along the direction Z.

In some embodiments, the plurality of conductive layers 213 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of conductive layers 213 may be formed during the formation of the first redistribution dielectric layer 211.

With reference to FIG. 3, the plurality of bridge layers 215 may be formed in the first redistribution dielectric layer 211. In some embodiments, the plurality of bridge layers 215 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of bridge layers 215 may be formed during the formation of the first redistribution dielectric layer 211.

The plurality of bridge layers 215 may be electrically isolated from the plurality of conductive layers 213. That is, the plurality of bridge layers 215 may be also electrically isolated from the functional units of the first die 110. In some embodiments, each of the plurality of bridge layers 215 may include a bridge portion 215-1 and two bridge pads 215-3. The bridge portion 215-1 may include a conductive line and two conductive vias (not separately labelled for clarity). The conductive line may be parallel to the front surface 110F of the first die 110. The bridge pads 215-3 may be parallel to the front surface 110F of the first die 110, separated from each other, and substantially coplanar with the front surface 210F of the first redistribution structure 210. The conductive vias may connect the bridge pads 215-3 and the conductive line along the direction Z.

It should be noted that the configuration of the plurality of bridge layers 215 in the present embodiment is just for illustrative purposes. Other configurations with the plurality of bridge layers 215 and the plurality of conductive layers 213 being electrically isolated may be employed.

Figure 4:
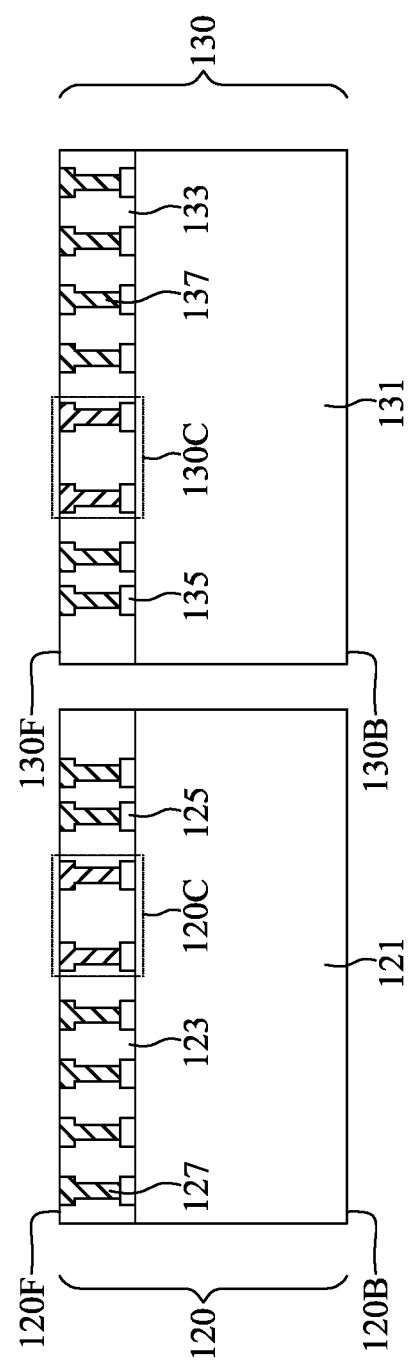

With reference to FIGS. 1 and 4, at step S13, a second die 120 and a third die 130 may be provided.

With reference to FIG. 4, the second die 120 may include a second substrate 121, a second dielectric layer 123, a plurality of second device elements 125, and a plurality of second conductive layers 127.

In some embodiments, the second substrate 121 may be a bulk semiconductor substrate. The bulk semiconductor substrate may be formed of, for example, an elementary semiconductor such as silicon or germanium, or a compound semiconductor such as silicon germanium, silicon carbide, gallium arsenide, gallium phosphide, indium phosphide, indium arsenide, indium antimonide, or other III-V compound semiconductor or II-VI compound semiconductor.

In some embodiments, the thickness of the second substrate 121 may be between about 500 μm and about 700 μm. For example, the thickness of the second substrate 121 may be about 600 μm.

In some embodiments, the plurality of second device elements 125 may be formed on the second substrate 121. Some portions of the plurality of second device elements 125 may be formed in the second substrate 121. The plurality of second device elements 125 may be transistors such as complementary metal-oxide-semiconductor transistors, metal-oxide-semiconductor field-effect transistors, fin field-effect-transistors, the like, or a combination thereof.

In some embodiments, the second dielectric layer 123 may be formed on the second substrate 121. The second dielectric layer 123 may be a stacked layer structure. The second dielectric layer 123 may include a plurality of insulating sub-layers. Each of the insulating sub-layers may have a thickness between about 0.5 μm and about 3.0 μm. The insulating sub-layers may be formed of, for example, silicon oxide, borophosphosilicate glass, undoped silicate glass, fluorinated silicate glass, low-k dielectric materials, the like, or a combination thereof. The insulating sub-layers may be formed of different materials but are not limited thereto. The insulating sub-layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

In some embodiments, the top surface of the second dielectric layer 123 may be referred to as the front surface 120F of the second die 120. The bottom surface of the second substrate 121 may be referred to as the back surface 120B of the second die 120.

In some embodiments, the plurality of second conductive layers 127 may be formed in the second dielectric layer 123. The plurality of second conductive layers 127 may electrically connect to the plurality of second device elements 125, respectively and correspondingly. The plurality of second conductive layers 127 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of second conductive layers 127 may be formed during the formation of the second dielectric layer 123.

In some embodiments, the plurality of second device elements 125 and the plurality of second conductive layers 127 may together configure functional units of the second die 120. In some embodiments, the functional units of the second die 120 may include, for example, highly complex circuits such as processor cores, memory controllers, or accelerator units. In some embodiments, the functional units of the second die 120 may include processor core intellectual properties, analog-to-digital converters, digital-to-analog converters, and phase-locked loops. In some embodiments, the second die 120 may be configured as a logic die. In some embodiments, some function units of the second die 120 may be referred to as the first cache unit 120C of the second die 120.

With reference to FIG. 4, the third die 130 may include a third substrate 131, a third dielectric layer 133, a plurality of third device elements 135, and a plurality of third conductive layers 137.

In some embodiments, the third substrate 131 may be a bulk semiconductor substrate. The bulk semiconductor substrate may be formed of, for example, an elementary semiconductor such as silicon or germanium, or a compound semiconductor such as silicon germanium, silicon carbide, gallium arsenide, gallium phosphide, indium phosphide, indium arsenide, indium antimonide, or other III-V compound semiconductor or II-VI compound semiconductor.

In some embodiments, the thickness of the third substrate 131 may be between about 500 μm and about 700 μm. For example, the thickness of the third substrate 131 may be about 600 μm.

In some embodiments, the plurality of third device elements 135 may be formed on the third substrate 131. Some portions of the plurality of third device elements 135 may be formed in the third substrate 131. The plurality of third device elements 135 may be transistors such as complementary metal-oxide-semiconductor transistors, metal-oxide-semiconductor field-effect transistors, fin field-effect-transistors, the like, or a combination thereof.

In some embodiments, the third dielectric layer 133 may be formed on the third substrate 131. The third dielectric layer 133 may be a stacked layer structure. The third dielectric layer 133 may include a plurality of insulating sub-layers. Each of the insulating sub-layers may have a thickness between about 0.5 μm and about 3.0 μm. The insulating sub-layers may be formed of, for example, silicon oxide, borophosphosilicate glass, undoped silicate glass, fluorinated silicate glass, low-k dielectric materials, the like, or a combination thereof. The insulating sub-layers may be formed of different materials but are not limited thereto. The insulating sub-layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

In some embodiments, the top surface of the third dielectric layer 133 may be referred to as the front surface 130F of the third die 130. The bottom surface of the third substrate 131 may be referred to as the back surface 130B of the third die 130.

In some embodiments, the plurality of third conductive layers 137 may be formed in the third dielectric layer 133. The plurality of third conductive layers 137 may electrically connect to the plurality of third device elements 135, respectively and correspondingly. The plurality of third conductive layers 137 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of third conductive layers 137 may be formed during the formation of the third dielectric layer 133.

In some embodiments, the plurality of third device elements 135 and the plurality of third conductive layers 137 may together configure functional units of the third die 130. In some embodiments, the functional units of the third die 130 may include, for example, highly complex circuits such as processor cores, memory controllers, or accelerator units. In some embodiments, the functional units of the third die 130 may include processor core intellectual properties, analog-to-digital converters, digital-to-analog converters, and phase-locked loops. In some embodiments, the third die 130 may be configured as a logic die. In some embodiments, some function units of the third die 130 may be referred to as the second cache unit 130C of the third die 130.

With reference to FIG. 4, in some embodiments, the layout of the second die 120 and the layout of the third die 130 may be substantially the same. In some embodiments, the layout of the second die 120 and the layout of the third die 130 may be in a mirror manner (as shown in FIG. 4).

With reference to FIG. 1 and FIGS. 5 to 9, at step S15, the first redistribution structure 210 may be bonded onto the second die 120 and the third die 130.

Figure 5:
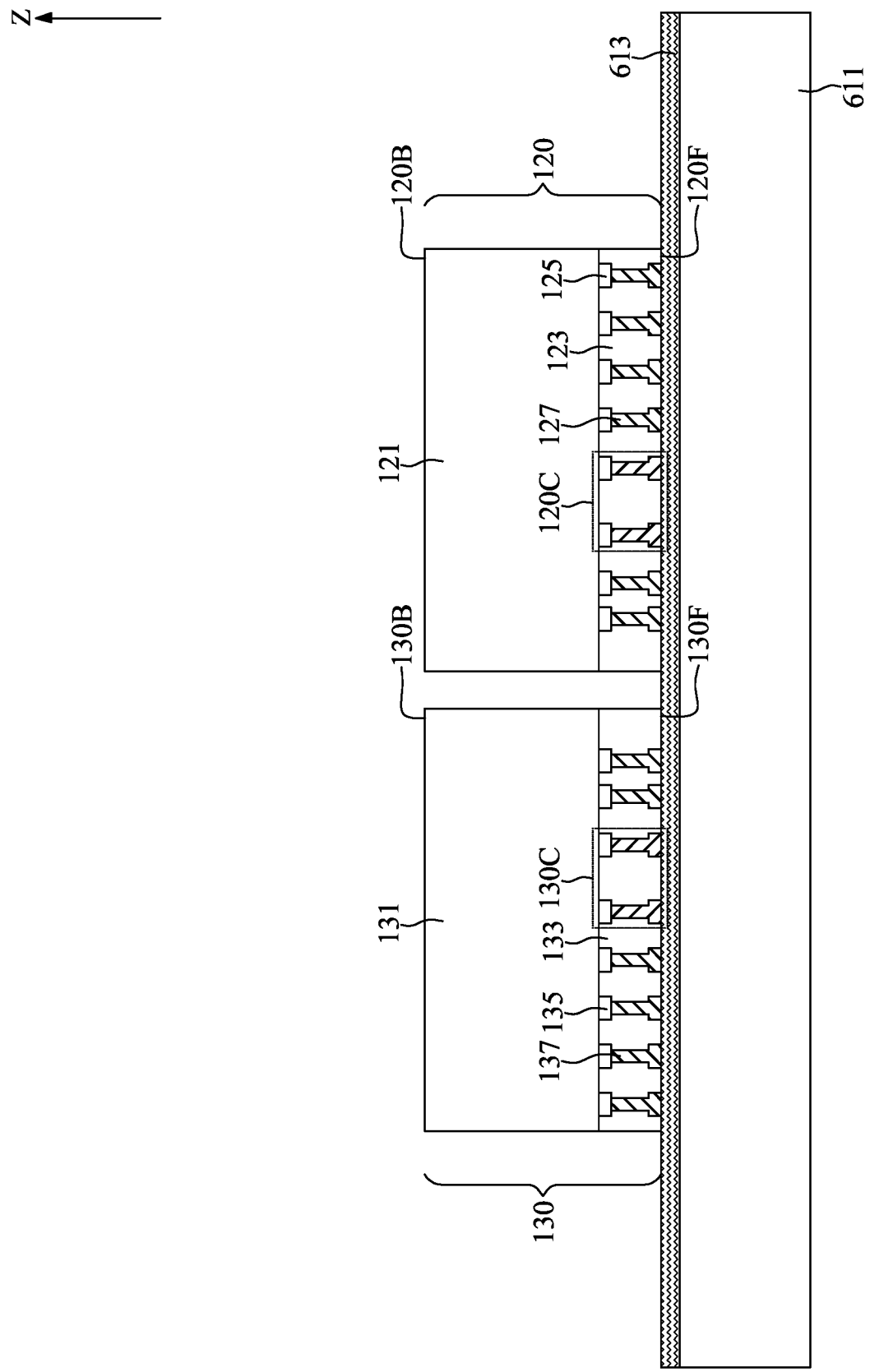

With reference to FIG. 5, the second die 120 and the third die 130 may be flipped and temporarily attached to a first carrier 611 using a first sacrificial layer 613. In some embodiments, the attachment may include an operation of forming the first sacrificial layer 613 on the top surfaces of the first carrier 611, and an operation of attaching the second die 120 and the third die 130 onto the first sacrificial layer 613. The first carrier 611 may have a size extending over the second die 120 and the third die 130.

In some embodiments, the first carrier 611 may be formed of a rigid material, and include metal, glass, ceramic, or the like. The first sacrificial layer 613 may be an adhesive tape or an adhesive solution. In some embodiments, the first sacrificial layer 613 may be die attach film, silver paste, or the like. In some embodiments, the first sacrificial layer 613 may further include gold, silver, alumina, or boron nitride particles.

Figure 6:
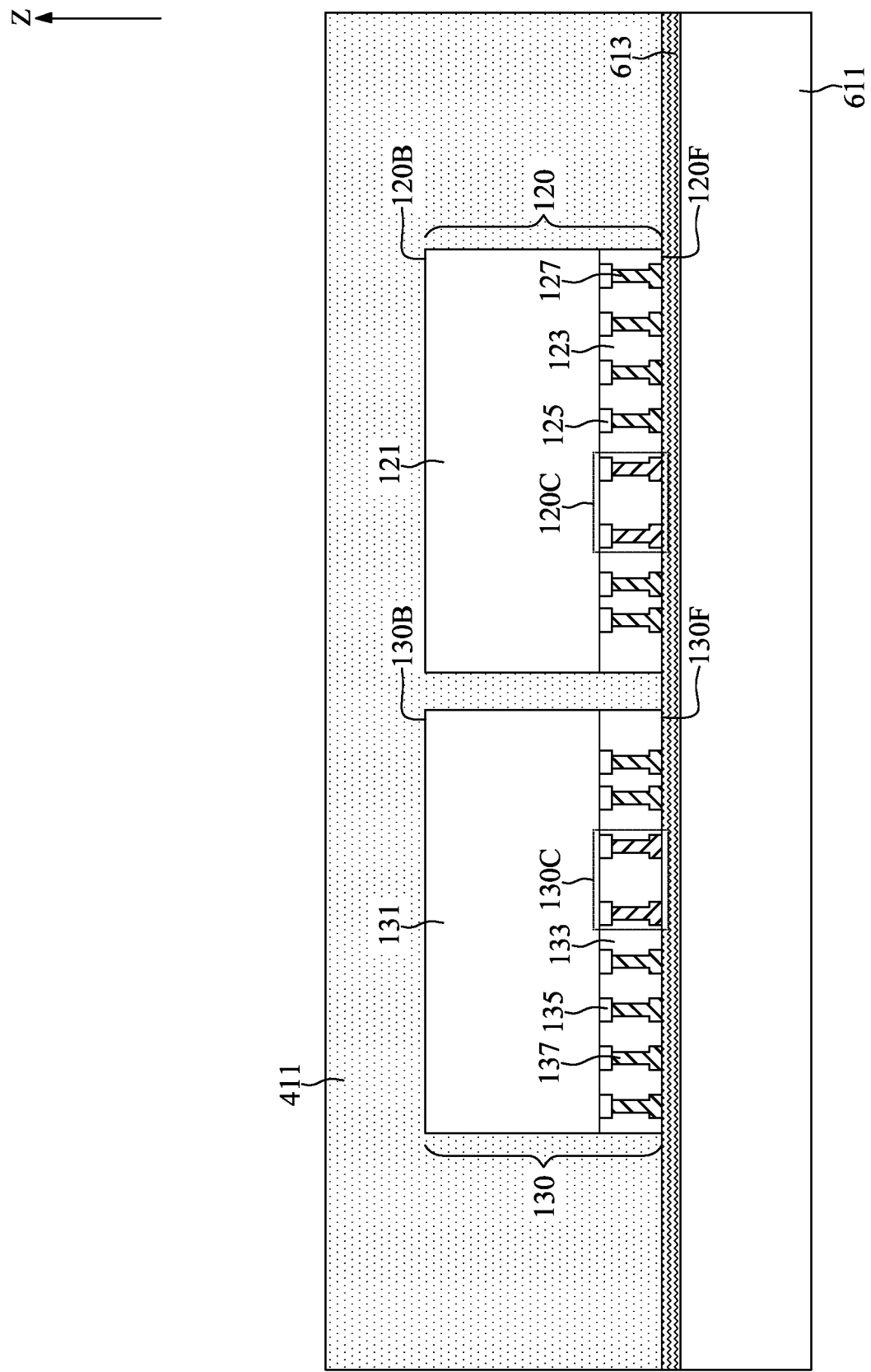

With reference to FIG. 6, a first molding layer 411 may be formed on the first sacrificial layer 613 to cover the second die 120 and the third die 130. In some embodiments, the first molding layer 411 may be formed of a molding compound such as polybenzoxazole, polyimide, benzocyclobutene, epoxy laminate, or ammonium bifluoride. The first molding layer 411 may be formed by compressive molding, transfer molding, liquid encapsulent molding, and the like. For example, a molding compound may be dispensed in liquid form. Subsequently, a curing process is performed to solidify the molding compound. The formation of molding compound may overflow the second die 120 and the third die 130 so that molding compound covers the second die 120 and the third die 130.

Figure 7:
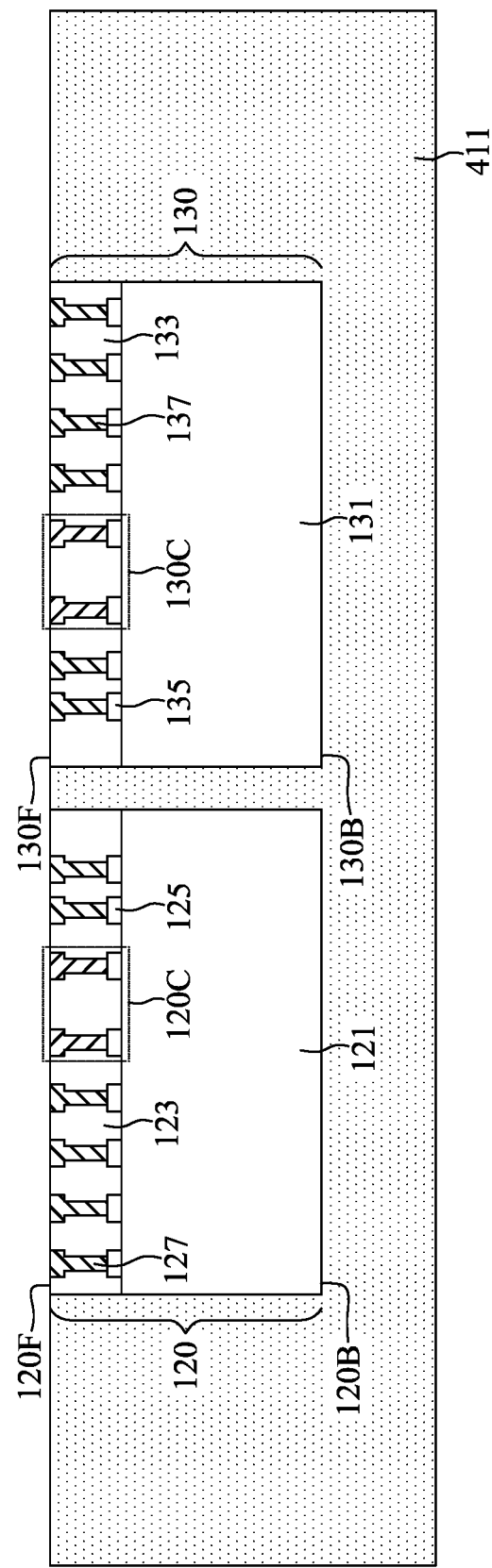

With reference to FIG. 7, the first carrier 611 may be detached by removing the first sacrificial layer 613. The second die 120, the third die 130 may be flipped. The front surface 120F of the second die 120 and the front surface 130F of the third die 130 may be faced up. In some embodiments, a planarization process, such as chemical mechanical polishing, may be performed to provide a substantially flat surface for subsequent processing steps.

Figure 8:
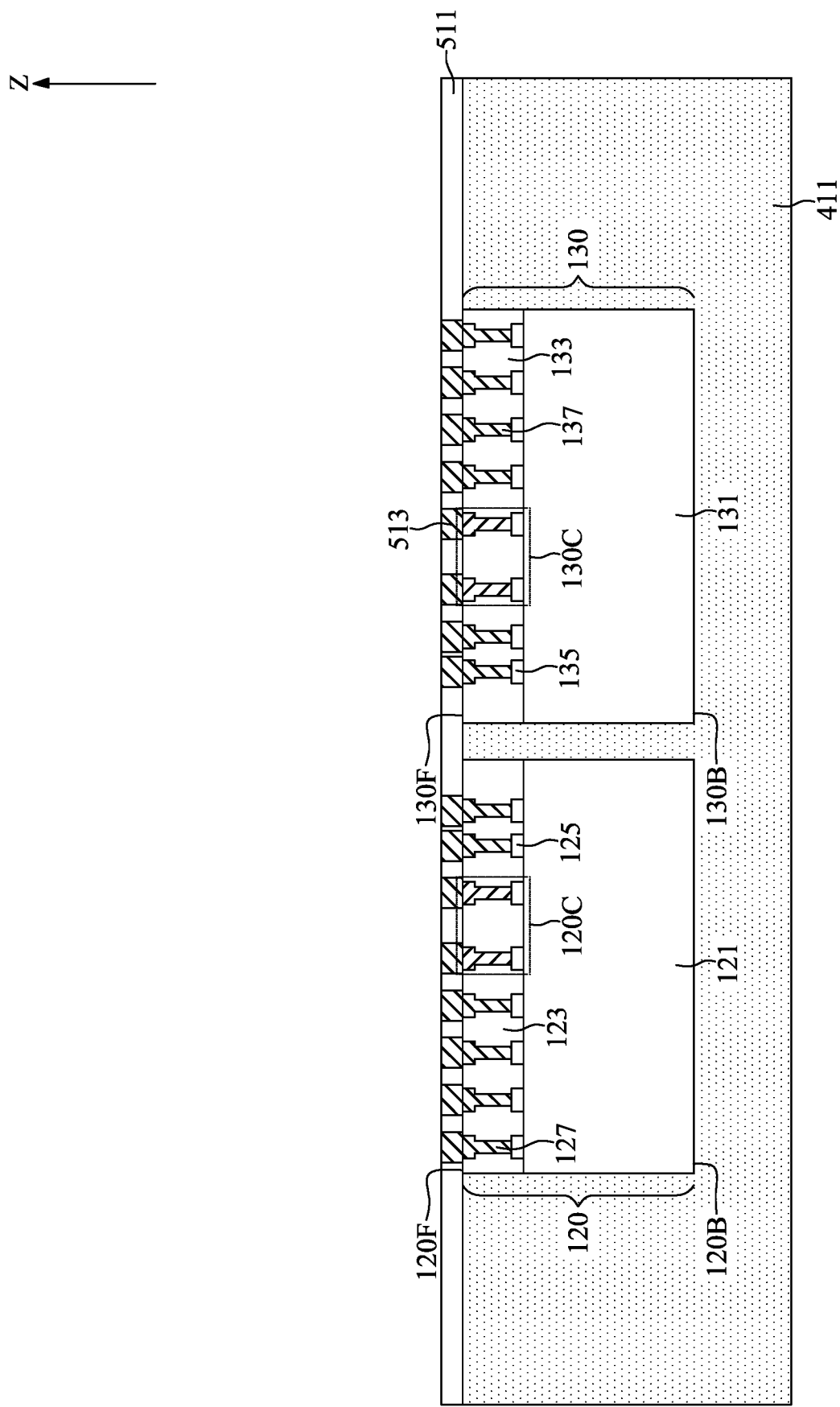

With reference to FIG. 8, a first passivation layer 511 may be formed on the first molding layer 411, on the front surface 120F of the second die 120, and on the front surface 130F of the third die 130. In some other embodiments, the first passivation layer 511 may be a dielectric layer. The dielectric layer may include a nitride such as silicon nitride, an oxide such as silicon oxide, an oxynitride such as silicon oxynitride, silicon nitride oxide, phosphosilicate glass, borosilicate glass, boron-doped phosphosilicate glass, or the like, or a combination thereof. In some embodiments, the first passivation layer 511 may include polybenzoxazole, polyimide, benzocyclobutene, ajinomoto buildup film, solder resist film, the like, or a combination thereof. The first passivation layer 511 formed of polymeric material may have a number of attractive characteristics such as the ability to fill openings of high aspect ratio, a relatively low dielectric constant (about 3.2), a simple depositing process, the reduction of sharp features or steps in the underlying layer, and high temperature tolerance after curing.

In some embodiments, the first passivation layer 511 may be formed by, for example, spin-coating, lamination, deposition, or the like. The deposition may include chemical vapor deposition such as plasma-enhanced chemical vapor deposition. The process temperature of the plasma-enhanced chemical vapor deposition may be between about 350° C. and about 450° C. The process pressure of the plasma-enhanced chemical vapor deposition may be between about 2.0 Torr and about 2.8 Torr. The process duration of the plasma-enhanced chemical vapor deposition may be between about 8 seconds and about 12 seconds.

With reference to FIG. 8, a plurality of first connecting layers 513 may be formed along the first passivation layer 511. The plurality of first connecting layers 513 may be electrically connected with the functional units of the second die 120 and the functional units of the third die 130, respectively and correspondingly. In some embodiments, pad openings (not shown in FIG. 8) may be formed along the first passivation layer 511 and a conductive material may be formed to fill the pad openings to form the plurality of first connecting layers 513. The pad openings may be formed by a photolithography process and a subsequent etching process. In some embodiments, the etching process may be an anisotropic dry etching process using argon and tetrafluoromethane as etchants. The process temperature of the etching process may be between about 120° C. and about 160° C. The process pressure of the etching process is between about 0.3 Torr and about 0.4 Torr. The process duration of the etching process may be between about 33 seconds and about 39 seconds. Alternatively, in some embodiments, the etching process may be an anisotropic dry etching process using helium and nitrogen trifluoride as etchants. The process temperature of the etching process may be between about 80° C. and about 100° C. The process pressure of the etching process is between about 1.2 Torr and about 1.3 Torr. The process duration of the etching process may be between about 20 seconds and about 30 seconds. In some embodiments, the conductive material may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

In some embodiments, the pad openings may be sequentially filled with the conductive material by sputtering or electroless plating. For example, when the pad openings are filled by sputtering using an aluminum-copper material as source, the process temperature of sputtering may be between about 100° C. and about 400° C. The process pressure of sputtering may be between about 1 mTorr and about 100 mTorr. For another example, the pad openings may be filled by an electroplating process using a plating solution. The plating solution may include copper sulfate, copper methane sulfonate, copper gluconate, copper sulfamate, copper nitrate, copper phosphate, or copper chloride. The pH of the plating solution may be between about 2 and about 6 or between about 3 and about 5. The process temperature of the electroplating process may be maintained between about 40° C. and about 75° C. or between about 50° C. and about 70° C.

Figure 9:
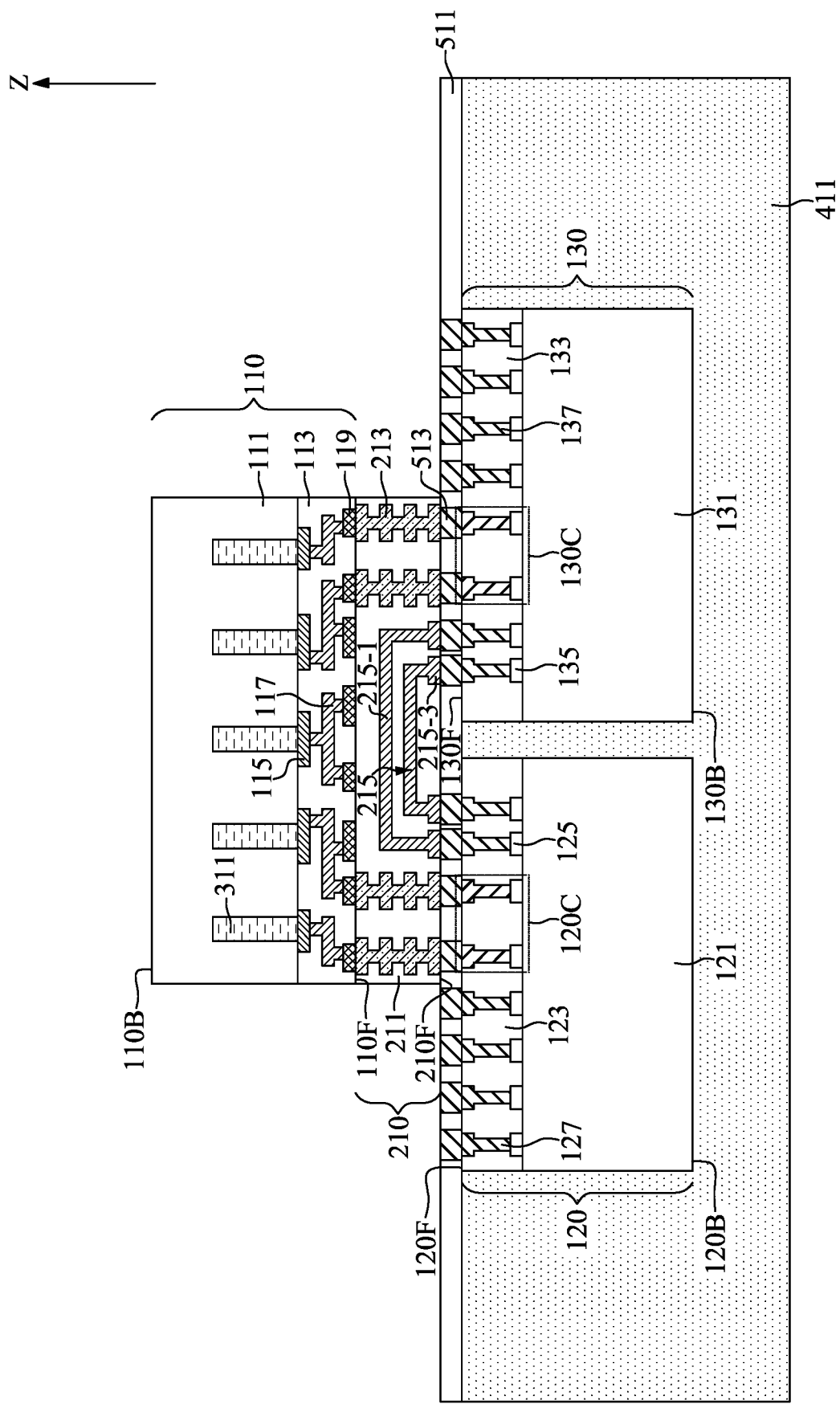

With reference to FIG. 9, the first die 110 and the first redistribution structure 210 may be flipped. The front surface 210F of the first redistribution structure 210 may be faced toward the first passivation layer 511. In some embodiments, the first die 110 and the first redistribution structure 210 may be bonded onto the first passivation layer 511 through a hybrid bonding process. In some embodiments, the hybrid bonding process such as thermo-compression bonding, passivation-capping-layer assisted bonding, or surface activated bonding. In some embodiments, the process pressure of the hybrid bonding process may be between about 100 MPa and about 150 MPa. In some embodiments, the process temperature of the hybrid bonding process may be between about room temperature (e.g., 25° C.) and about 400° C. In some embodiments, surface treatments such as wet chemical cleaning and gas/vapor-phase thermal treatments may be used to lower the process temperature of the hybrid bonding process or to shorten the time consuming of the hybrid bonding process. In some embodiments, the hybrid bonding process may include, for example, dielectric-to-dielectric bonding, metal-to-metal bonding, and metal-to-dielectric bonding.

In some embodiments, the dielectric-to-dielectric bonding may originate from the bonding between the first redistribution dielectric layer 211 and the first passivation layer 511. The metal-to-metal bonding may originate from the bonding between the plurality of conductive layers 213 and the plurality of first connecting layers 513, and between the bridge pad 215-3 and the plurality of first connecting layers 513. The metal-to-dielectric bonding may originate from the bonding between the plurality of conductive layers 213 and the first passivation layer 511, and between the plurality of first connecting layers 513 and the first redistribution dielectric layer 211.

In some embodiments, a thermal annealing process may be performed after the bonding process to enhance dielectric-to-dielectric bonding and to induce thermal expansion of metal-to-metal bonding so as to further improve the bonding quality.

In some embodiments, when the first passivation layer 511 and the first redistribution dielectric layer 211 are formed of, for example, silicon oxide or silicon nitride, the bonding between the first passivation layer 511 and the first redistribution dielectric layer 211 may be based on the hydrophilic bonding mechanism. Hydrophilic surface modifications may be applied to the first passivation layer 511 and the first redistribution dielectric layer 211 before bonding.

In some embodiments, when the first passivation layer 511 and the first redistribution dielectric layer 211 are formed of polymer adhesives such as polyimide, benzocyclobutenes, and polybenzoxazole, the bonding between the first passivation layer 511 and the first redistribution dielectric layer 211 may be based on thermo-compression bonding.

With reference to FIG. 9, the signals of the functional units of the second die 120 and the functional units of the third die 130 may be communicated by the plurality of bridge layers 215 of the first redistribution structure 210. The first cache unit 120C of the second die 120 and the second cache unit 130C of the third die 130 may respectively electrically couple to the functional units of the first die 110 through the corresponding first connecting layers 513 and corresponding conductive layers 213.

In the present embodiment, the first cache unit 120C and the second cache unit 130C may be topographically aligned with the first die 110. The first cache unit 120C and the second cache unit 130C may be completely covered (overlapped) by the first die 110 in a top-view perspective (not shown).

By employing the plurality of bridge layers 215, the second die 120 (e.g., a logic die) and the third die 130 (e.g., a logic die) may operate cooperatively while respectively maintaining the accessing to the first die 110 (e.g., a cache memory).

With reference to FIG. 1 and FIGS. 10 to 15, at step S17, a plurality of through molding vias 313 may be formed to electrically couple to the second die 120 and the third die 130.

Figure 10:
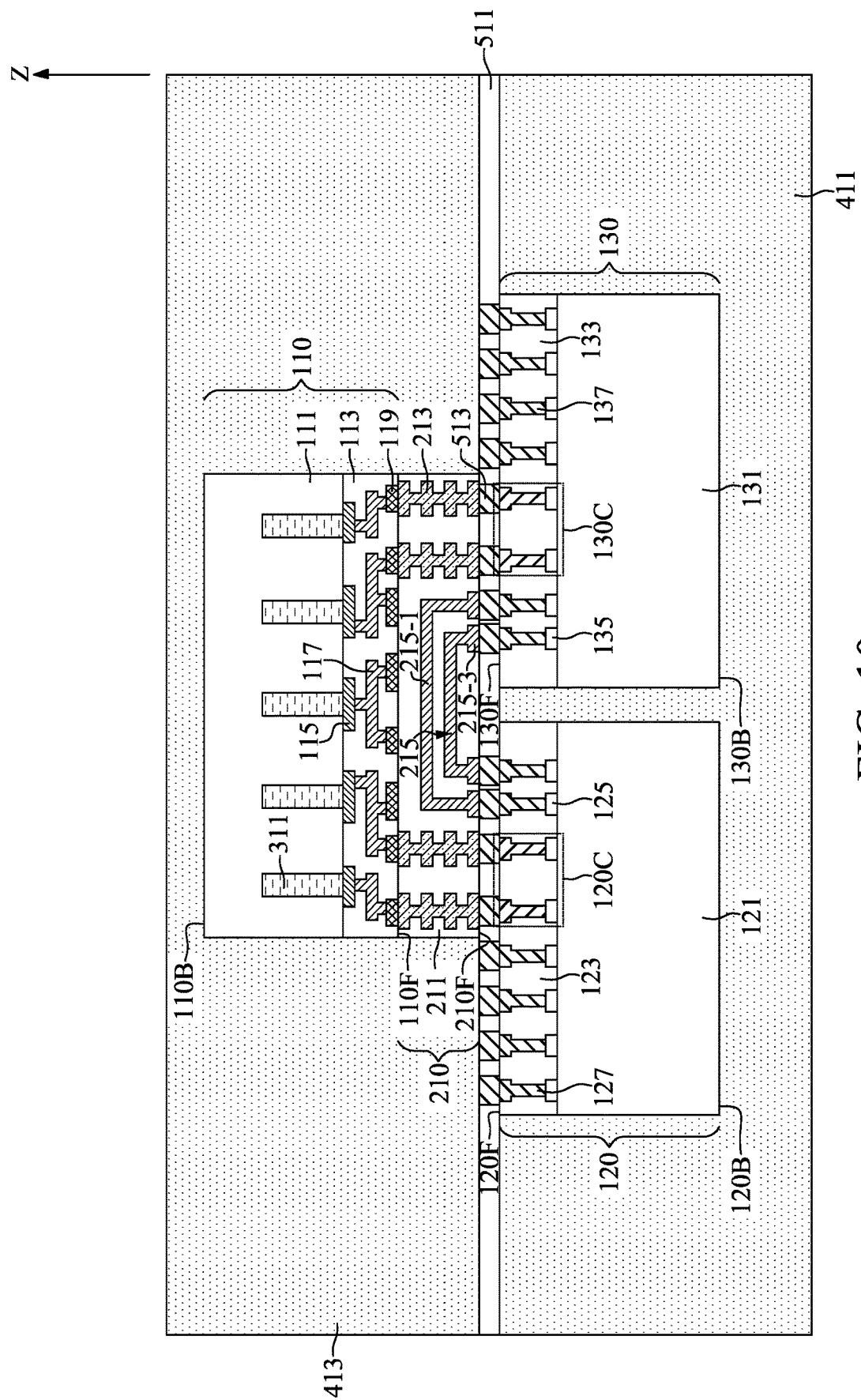

With reference to FIG. 10, a second molding layer 413 may be formed on the first passivation layer 511 to cover the first die 110 and the first redistribution structure 210. In some embodiments, the second molding layer 413 may be formed of a molding compound such as polybenzoxazole, polyimide, benzocyclobutene, epoxy laminate, or ammonium bifluoride. The second molding layer 413 may be formed by compressive molding, transfer molding, liquid encapsulent molding, and the like. For example, a molding compound may be dispensed in liquid form. Subsequently, a curing process is performed to solidify the molding compound. The formation of molding compound may overflow the first die 110 and the first redistribution structure 210 so that molding compound covers the first die 110 and the first redistribution structure 210.

Figure 11:
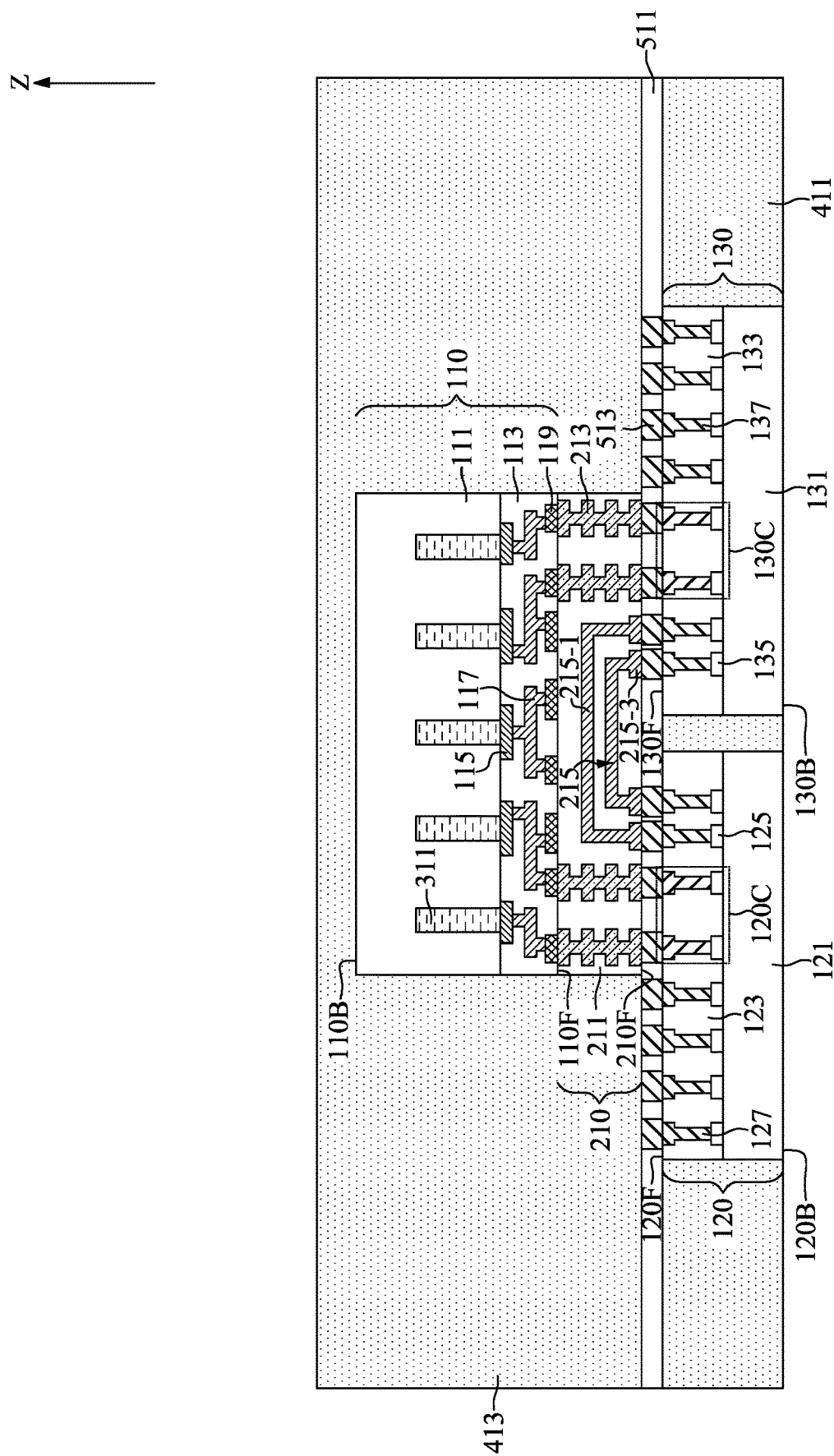

With reference to FIG. 11, a planarization process such as mechanical grinding, chemical mechanical polish, or other etch back technique may be employed to remove excess portions of the first molding layer 411, the second substrate 121, and the third substrate 131 and provide a substantially flat surface. The second die 120 and the third die 130 may be exposed after the planarization process. In some embodiments, the intermediate semiconductor device illustrated in FIG. 10 may be flipped before the planarization process. The thickness of the second die 120 and the thickness of the third die 130 may be reduced to improve heat dissipation.

Figure 12:
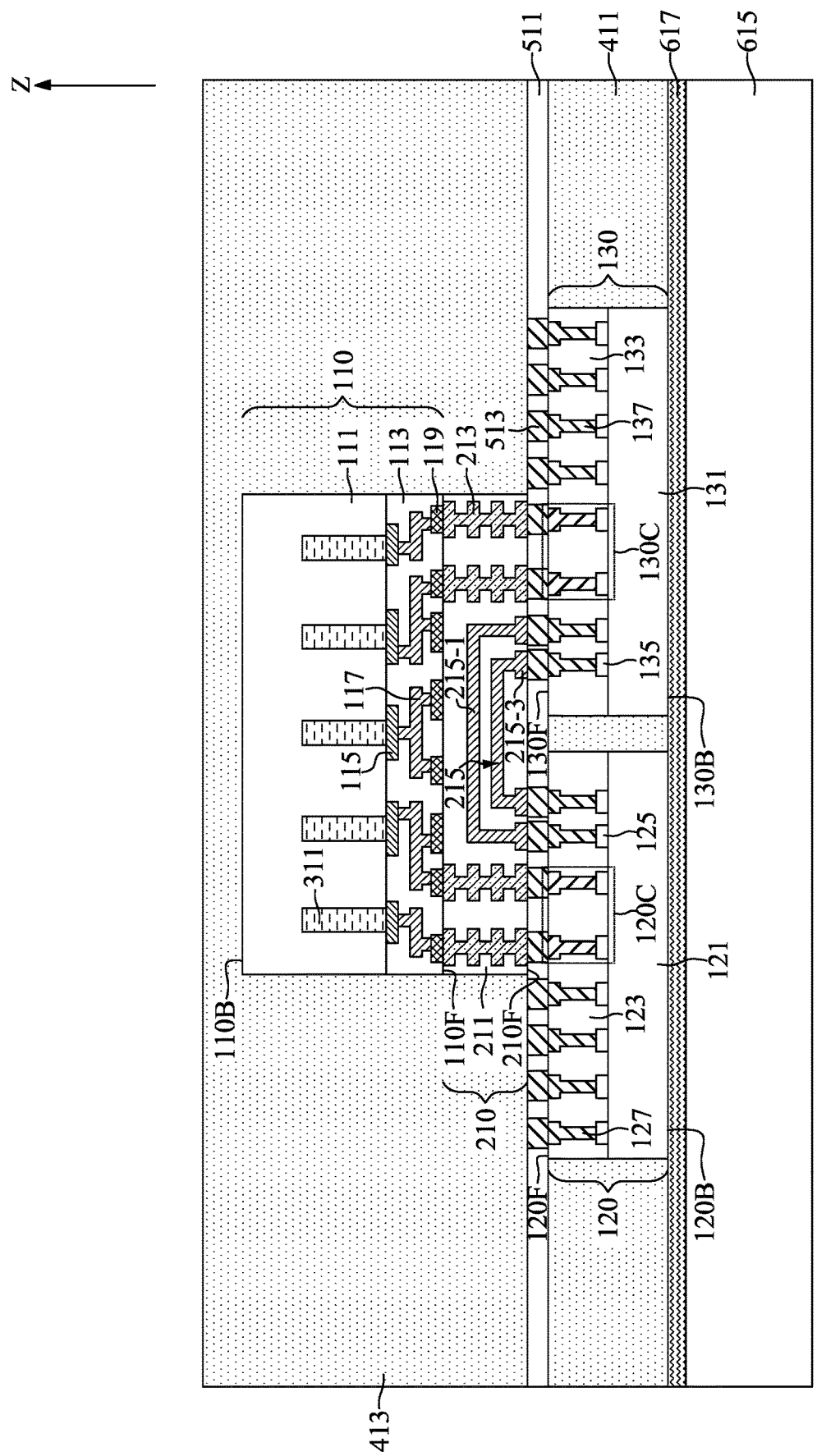

With reference to FIG. 12, the second die 120 and the third die 130 may temporarily attach to a second carrier 615 using a second sacrificial layer 617. In some embodiments, the attachment may include an operation of forming the second sacrificial layer 617 on the top surfaces of the second carrier 615, and an operation of attaching the second die 120 and the third die 130 onto the second sacrificial layer 617.

In some embodiments, the second carrier 615 may be formed of a rigid material, and include metal, glass, ceramic, or the like. The second sacrificial layer 617 may be an adhesive tape or an adhesive solution. In some embodiments, the second sacrificial layer 617 may be die attach film, silver paste, or the like. In some embodiments, the second sacrificial layer 617 may further include gold, silver, alumina, or boron nitride particles.

Figure 13:
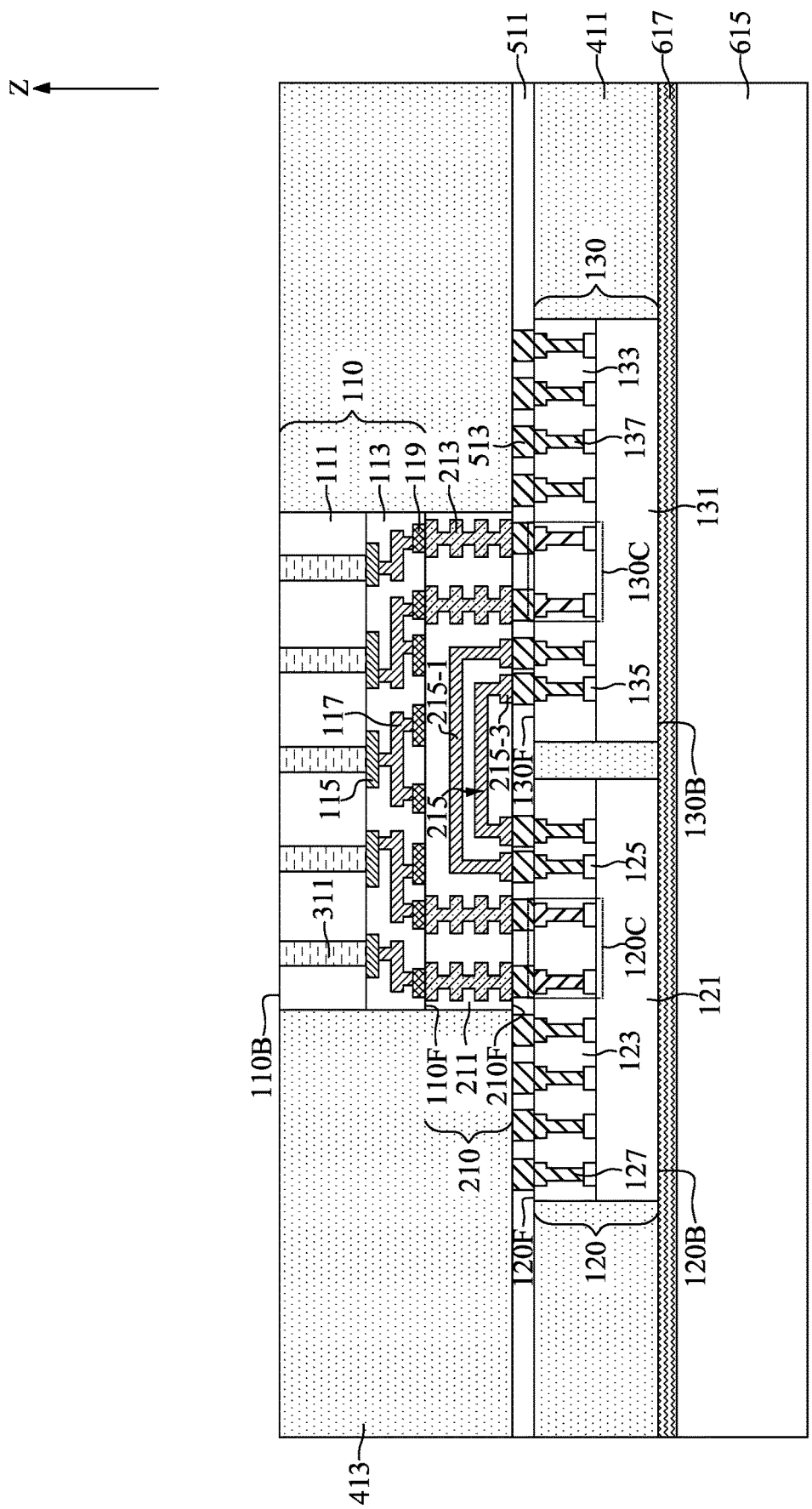

With reference to FIG. 13, a planarization process such as mechanical grinding, chemical mechanical polish, or other etch back technique may be employed to remove excess portions of the second molding layer 413, the first substrate 111, and the through substrate vias 311 and provide a substantially flat surface. The first die 110 and the plurality of through substrate vias 311 may be exposed after the planarization process. The thickness of the first die 110 may be reduced to improve heat dissipation.

Figure 14:
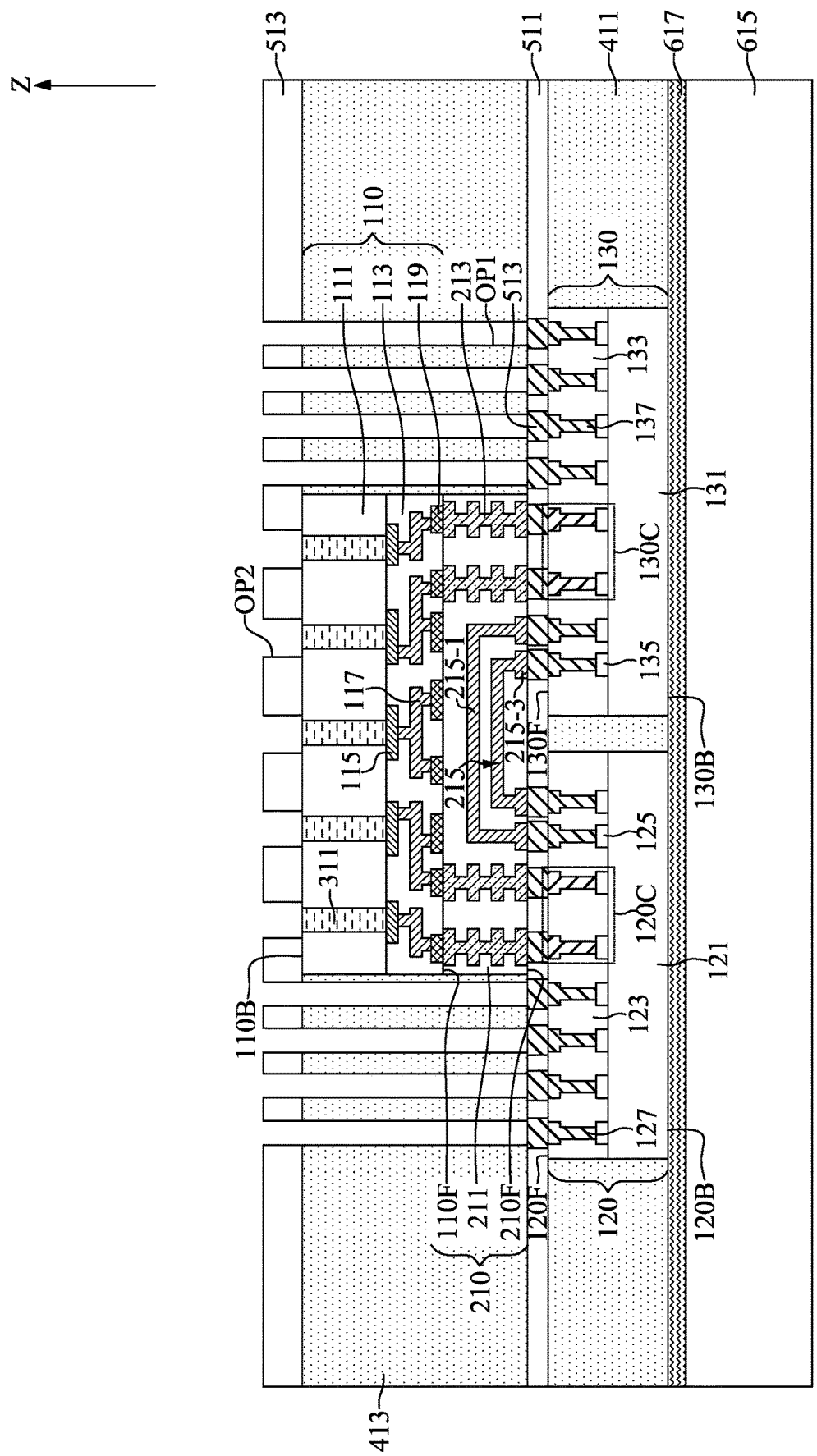

With reference to FIG. 14, a second passivation layer 515 may be formed on the second molding layer 413, on the back surface 110B of the first die 110, and on the plurality of through substrate vias 311. In some other embodiments, the second passivation layer 515 may be a dielectric layer. The dielectric layer may include a nitride such as silicon nitride, an oxide such as silicon oxide, an oxynitride such as silicon oxynitride, silicon nitride oxide, phosphosilicate glass, borosilicate glass, boron-doped phosphosilicate glass, or the like, or a combination thereof. In some embodiments, the second passivation layer 515 may include polybenzoxazole, polyimide, benzocyclobutene, ajinomoto buildup film, solder resist film, the like, or a combination thereof. The second passivation layer 515 formed of polymeric material may have a number of attractive characteristics such as the ability to fill openings of high aspect ratio, a relatively low dielectric constant (about 3.2), a simple depositing process, the reduction of sharp features or steps in the underlying layer, and high temperature tolerance after curing.

In some embodiments, the second passivation layer 515 may be formed by, for example, spin-coating, lamination, deposition, or the like. The deposition may include chemical vapor deposition such as plasma-enhanced chemical vapor deposition. The process temperature of the plasma-enhanced chemical vapor deposition may be between about 350° C. and about 450° C. The process pressure of the plasma-enhanced chemical vapor deposition may be between about 2.0 Torr and about 2.8 Torr. The process duration of the plasma-enhanced chemical vapor deposition may be between about 8 seconds and about 12 seconds.

With reference to FIG. 14, a plurality of first openings OP1 may be formed along the second passivation layer 515 and the second molding layer 413 to expose the plurality of first connecting layers 513. A plurality of second openings OP2 may be formed along the second passivation layer 515 to expose the plurality of through substrate vias 311.

Figure 15:
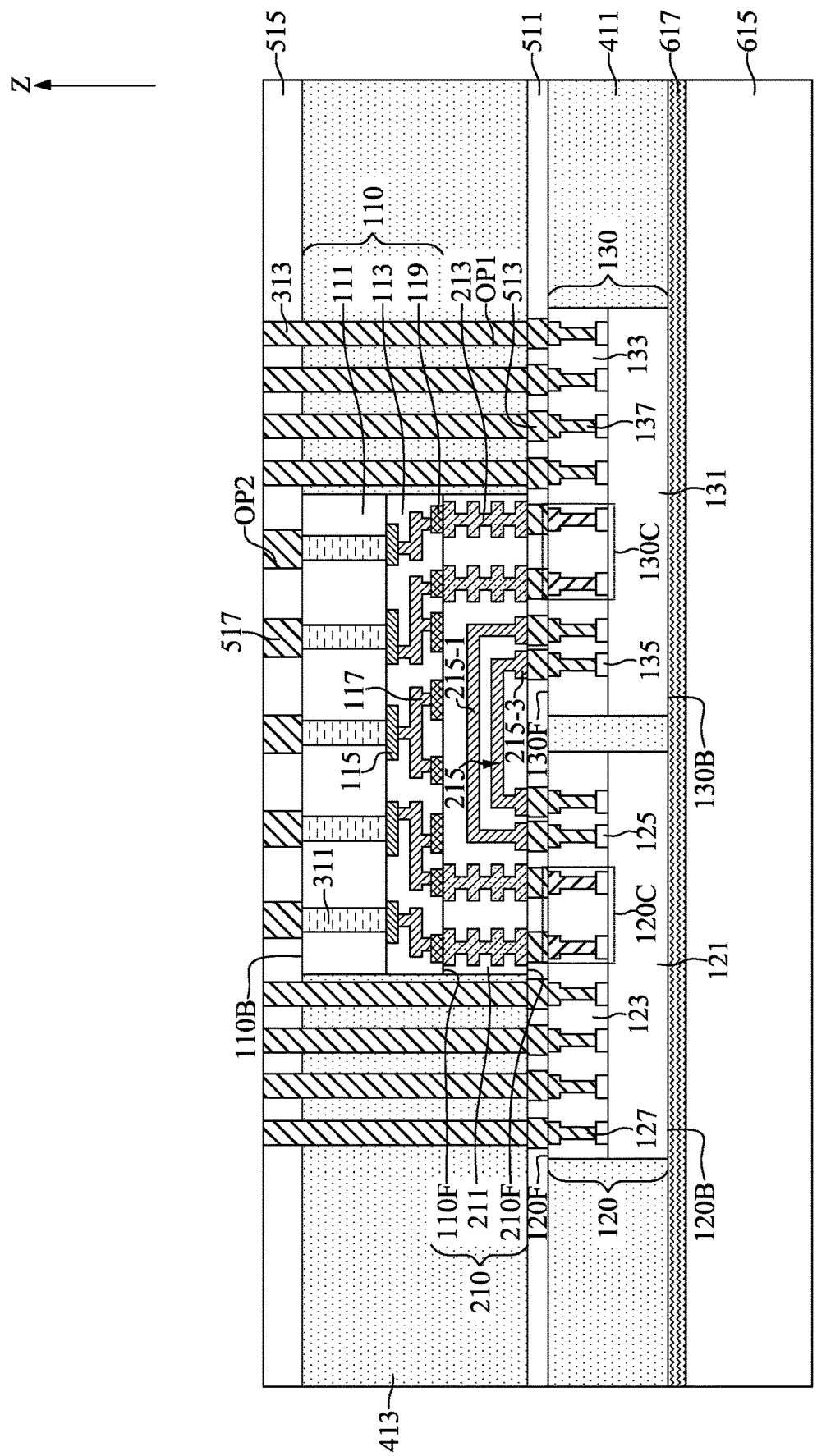

With reference to FIG. 15, a plurality of through molding vias 313 may be formed in the plurality of first openings OP1, respectively and correspondingly. A plurality of second connecting layers 517 may be formed in the plurality of second openings OP2, respectively and correspondingly. The plurality of through molding vias 313 may be electrically coupled to the functional units of the second die 120 and the functional units of the third die 130 through the plurality of first connecting layers 513. The plurality of second connecting layers 517 may be electrically coupled to the first die 110 through the plurality of through substrate vias 311.

In some embodiments, the plurality of through molding vias 313 and the plurality of second connecting layers 517 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

In some embodiments, the plurality of through molding vias 313 and the plurality of second connecting layers 517 may be formed by sputtering, electroless plating, or other applicable deposition process. For example, when the plurality of first openings OP1 and the plurality of second openings OP2 are filled by sputtering using an aluminum-copper material as source, the process temperature of sputtering may be between about 100° C. and about 400° C. The process pressure of sputtering may be between about 1 mTorr and about 100 mTorr. For another example, the plurality of first openings OP1 and the plurality of second openings OP2 may be filled by an electroplating process using a plating solution. The plating solution may include copper sulfate, copper methane sulfonate, copper gluconate, copper sulfamate, copper nitrate, copper phosphate, or copper chloride. The pH of the plating solution may be between about 2 and about 6 or between about 3 and about 5. The process temperature of the electroplating process may be maintained between about 40° C. and about 75° C. or between about 50° C. and about 70° C.

A planarization process, such as chemical mechanical polishing, may be performed until the second passivation layer 515 is exposed to remove excess material and provide a substantially flat surface for subsequent processing steps.

With reference to FIG. 1 and FIGS. 16 to 19, at step S19, the first die 110 may be bonded onto an interposer 711.

Figure 16:
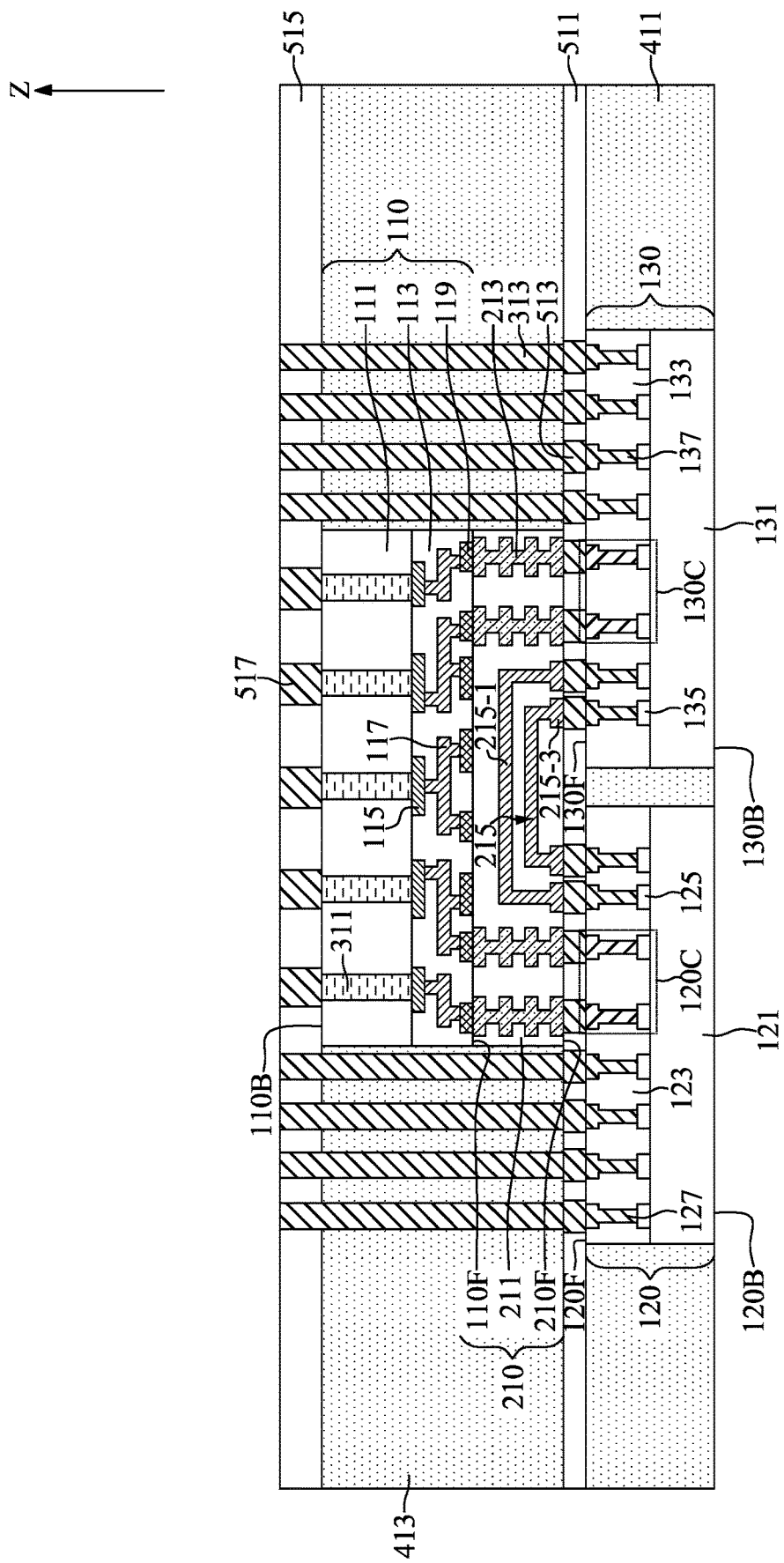

With reference to FIG. 16, the second carrier 615 may be detached by removing the second sacrificial layer 617. In some embodiments, a planarization process, such as chemical mechanical polishing, may be performed on the back surface 120B of the second die 120 and on the back surface 130B of the third die 130 to provide a substantially flat surface for subsequent processing steps.

Figure 17:
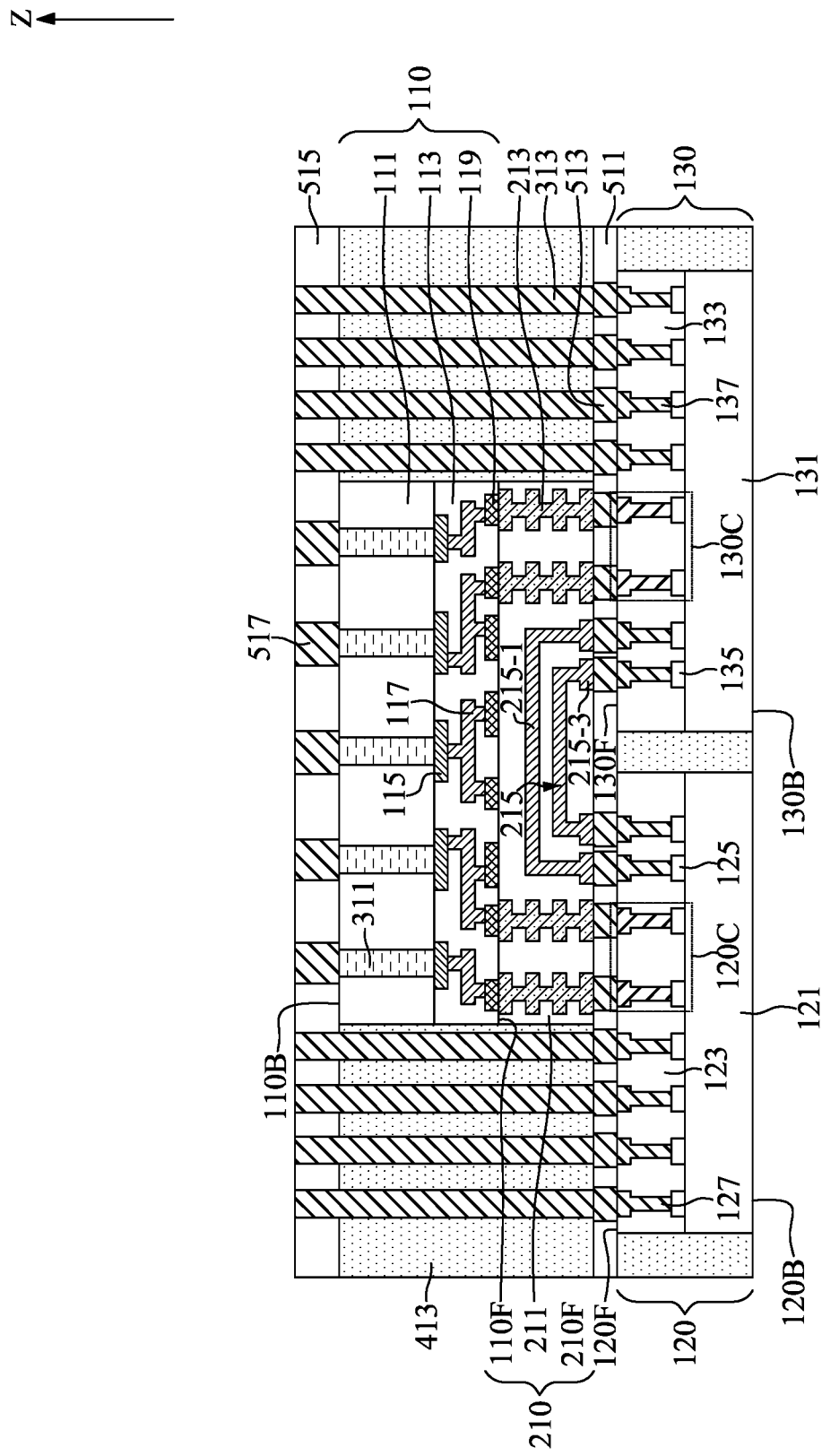

With reference to FIG. 17, the intermediate semiconductor device illustrated in FIG. 16 may be sawed.

With reference to FIGS. 18 and 19, the intermediate semiconductor device illustrated in FIG. 17 may be flipped. The second passivation layer 515 may be faced down. The intermediate semiconductor device may be bonded onto the interposer 711. In some embodiments, the second passivation layer 515 may be bonded onto the interposer 711 through a hybrid bonding process. In some embodiments, the hybrid bonding process such as thermo-compression bonding, passivation-capping-layer assisted bonding, or surface activated bonding. In some embodiments, the process pressure of the hybrid bonding process may be between about 100 MPa and about 150 MPa. In some embodiments, the process temperature of the hybrid bonding process may be between about room temperature (e.g., 25° C.) and about 400° C. In some embodiments, surface treatments such as wet chemical cleaning and gas/vapor-phase thermal treatments may be used to lower the process temperature of the hybrid bonding process or to shorten the time consuming of the hybrid bonding process. In some embodiments, the hybrid bonding process may include, for example, dielectric-to-dielectric bonding, metal-to-metal bonding, and metal-to-dielectric bonding.

Figure 20:
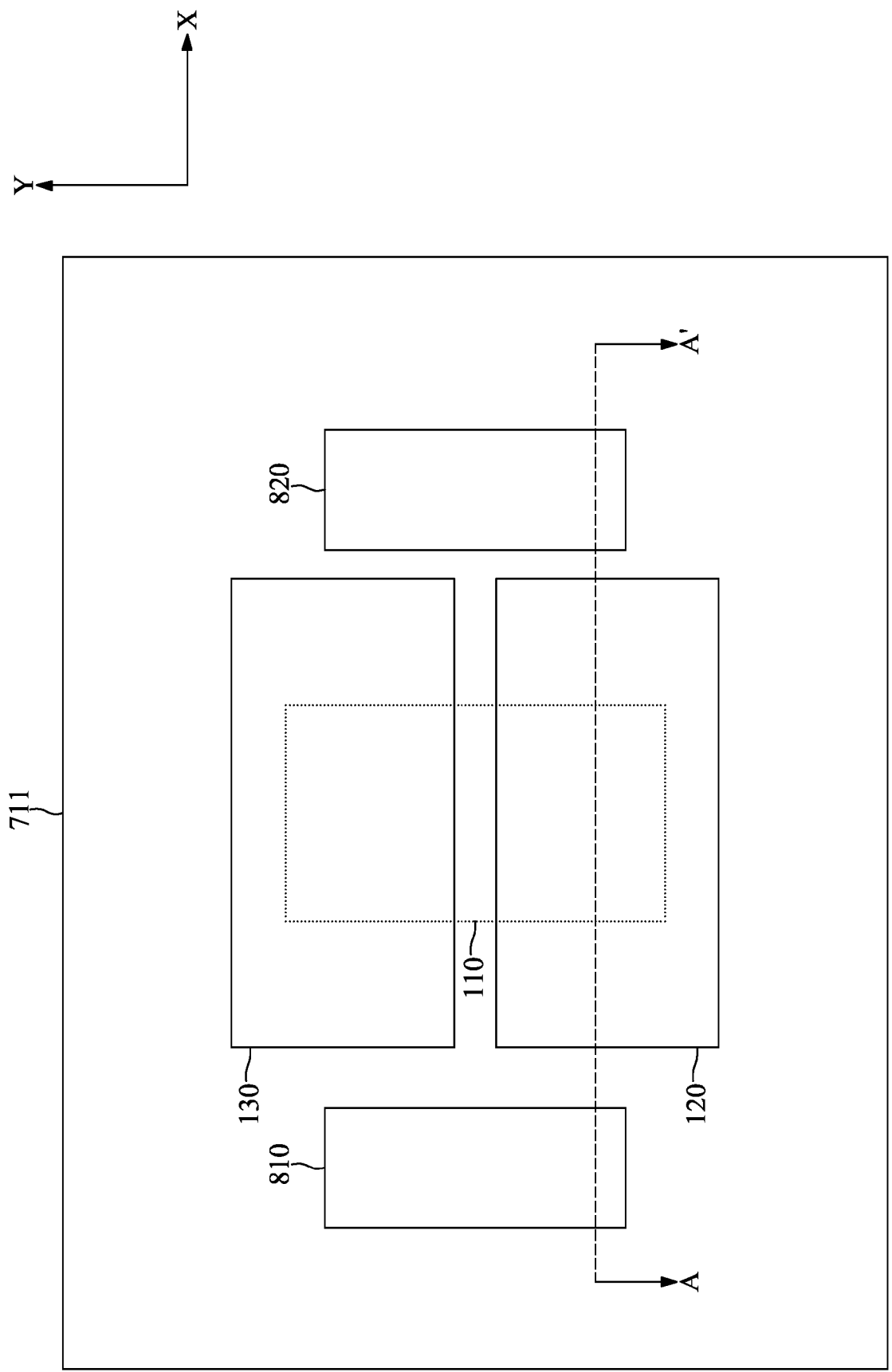
FIG. 20 illustrates, in a schematic top-view diagram, a semiconductor device in accordance with another embodiment of the present disclosure.
Figure 21:
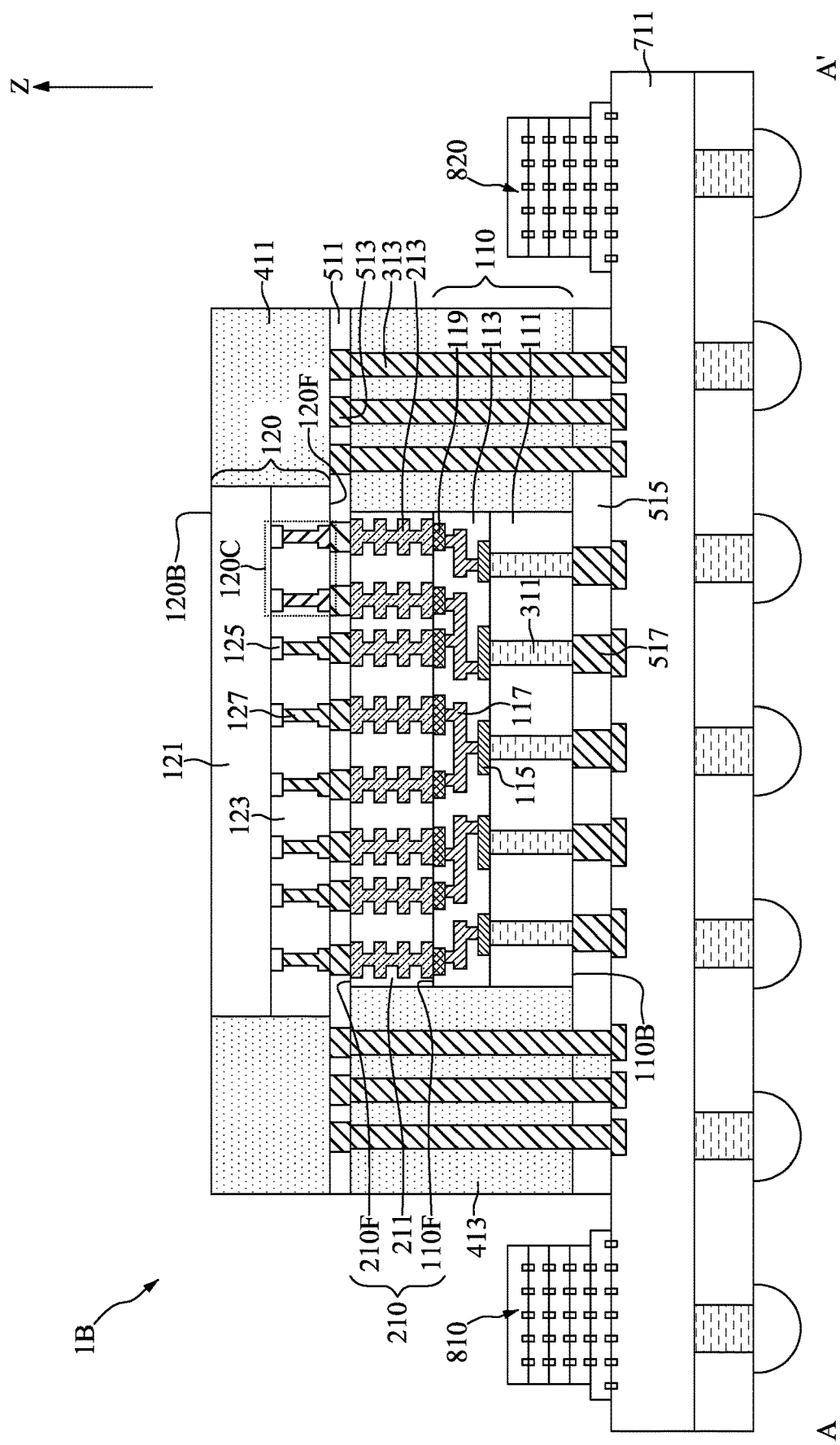
FIG. 21 is a schematic cross-sectional view diagram taken along a line A-A' in FIG. 20.

FIG. 20 illustrates, in a schematic top-view diagram, a semiconductor device 1B in accordance with another embodiment of the present disclosure. FIG. 21 is a schematic cross-sectional view diagram taken along a line A-A' in FIG. 20. The semiconductor device 1B in FIG. 21 may have a structure similar to that illustrated in FIG. 19. The same or similar elements in FIG. 21 as in FIG. 19 have been marked with similar reference numbers and duplicative descriptions have been omitted. It should be noted that some elements of the semiconductor device 1A may be simplified or omitted in the top-view diagram for clarity.

With reference to FIGS. 20 and 21, the semiconductor device 1B may include a fourth die 810 and a fifth die 820. The fourth die 810 and the fifth die 820 may include storage units (not shown) and functional units such as storage circuitry, control circuit, and/or high-speed circuitry. The fourth die 810 and the fifth die 820 may be configured as memory dies such as high bandwidth memory. The fourth die 810 and the fifth die 820 may be disposed on the interposer 711 and may electrically couple to the first die 110.

Figure 22:
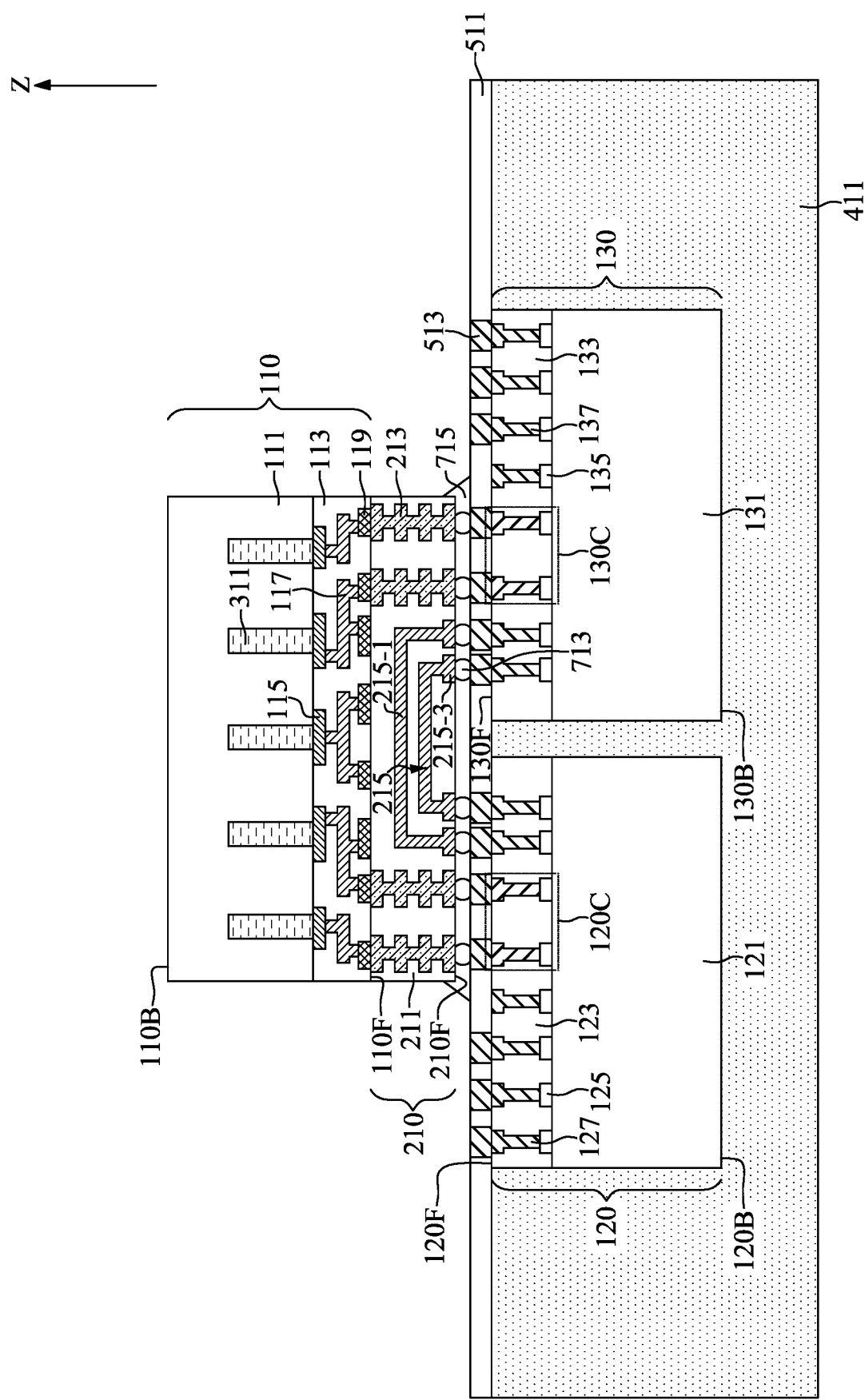
FIGS. 22 and 23 illustrate, in schematic cross-sectional view diagrams, part of a flow for fabricating a semiconductor device in accordance with another embodiment of the present disclosure.
Figure 23:
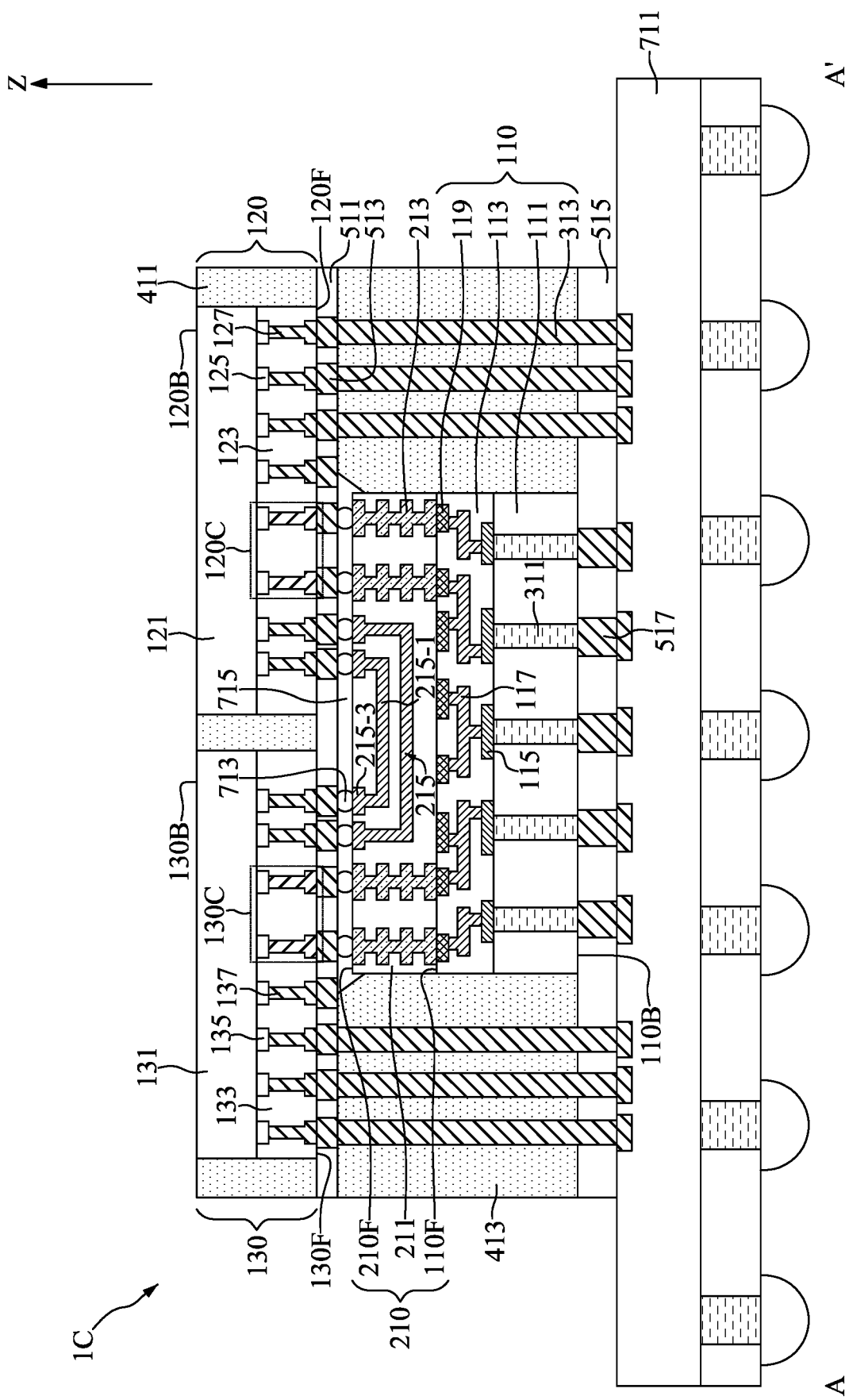

FIGS. 22 and 23 illustrate, in schematic cross-sectional view diagrams, part of a flow for fabricating a semiconductor device 1C in accordance with another embodiment of the present disclosure.

With reference to FIG. 22, the intermediate semiconductor device may have a structure similar to that illustrated in FIG. 9. The same or similar elements in FIG. 22 as in FIG. 9 have been marked with similar reference numbers and duplicative descriptions have been omitted.

With reference to FIG. 22, the first redistribution structure 210 may be bonded onto the first passivation layer 511 through a plurality of connecting units 713. The plurality of connecting units 713 may electrically connect the plurality of conductive layers 213 and the corresponding first connecting layers 513 and electrically connect the bridge pad 215-3 and the corresponding first connecting layers 513. In some embodiments, the plurality of connecting units 713 may be solder balls. The bonding process may be performed by using a thermal compression process and/or a reflow process. In some embodiments, the plurality of connecting units 713 may include a conductive material with low resistivity, such as tin, lead, silver, copper, nickel, bismuth or an alloy thereof, and may be formed by a suitable process such as evaporation, plating, or ball drop.

In some embodiments, the plurality of connecting units 713 may be solder joints. The solder joints may comprise a material such as tin, or other suitable materials, such as silver or copper. In an embodiment in which the solder joints are tin solder joints, the solder joints may be formed by initially forming a layer of tin through evaporation, electroplating, printing, solder transfer, or ball placement to a thickness of about 10 μm to about 100 μm. Once the layer of tin has been formed on the first passivation layer 511, a reflow process may be performed to shape the solder joints into the desired shape.

In some embodiments, the plurality of connecting units 713 may be pillar bumps formed of, for example, copper. The pillar bumps may be formed directly on the front surface 210F of the first redistribution structure 210, without requiring contact pads, under bump metallization, or the like, thus further reducing cost and process complexity of the semiconductor device 1C, which may allow for increased density of pillar bumps. For example, in some embodiments, a critical dimension of a pillar bump (e.g., pitch) may be less than about 5 μm, and the pillar bump may have a height less than about 10 μm. The pillar bumps may be formed using any suitable method, such as, depositing a seed layer, optionally forming an under bump metallurgy, using a mask to define a shape of the pillar bumps, electro-chemically plating the pillar bumps in the mask, and subsequently removing the mask and any undesired portions of the seed layer.

With reference to FIG. 22, an under-fill layer 715 may be formed between the first redistribution structure 210 and the first passivation layer 511, and surrounding the plurality of connecting units 713. In some embodiments, the under-fill layer 715 may also seal a portion of the lateral surfaces (e.g., side surfaces) of the first redistribution structure 210. In some embodiments, the under-fill layer 715 may be formed by curing an underfill material which is made up of a cross-linked organic resin and low Coefficient of Thermal Expansion (CTE) inorganic particles (up to 75 wt. %). In some embodiments, the underfill material before curing may be formulated with a liquid resin such as epoxies, a hardener such as anhydride or amines, an elastomer for toughening, a catalyst for promoting cross-linking, and other additives for flow modification and adhesion.

The under-fill layer 715 may tightly adhere to the first redistribution structure 210 and the first passivation layer 511 so as to the under-fill layer 715 may redistribute the stresses and strains from the CTE mismatch and mechanical shock over the intermediate semiconductor device. As a result, the anti-cracking capability of the intermediate semiconductor device may be improved.

Figure 24:
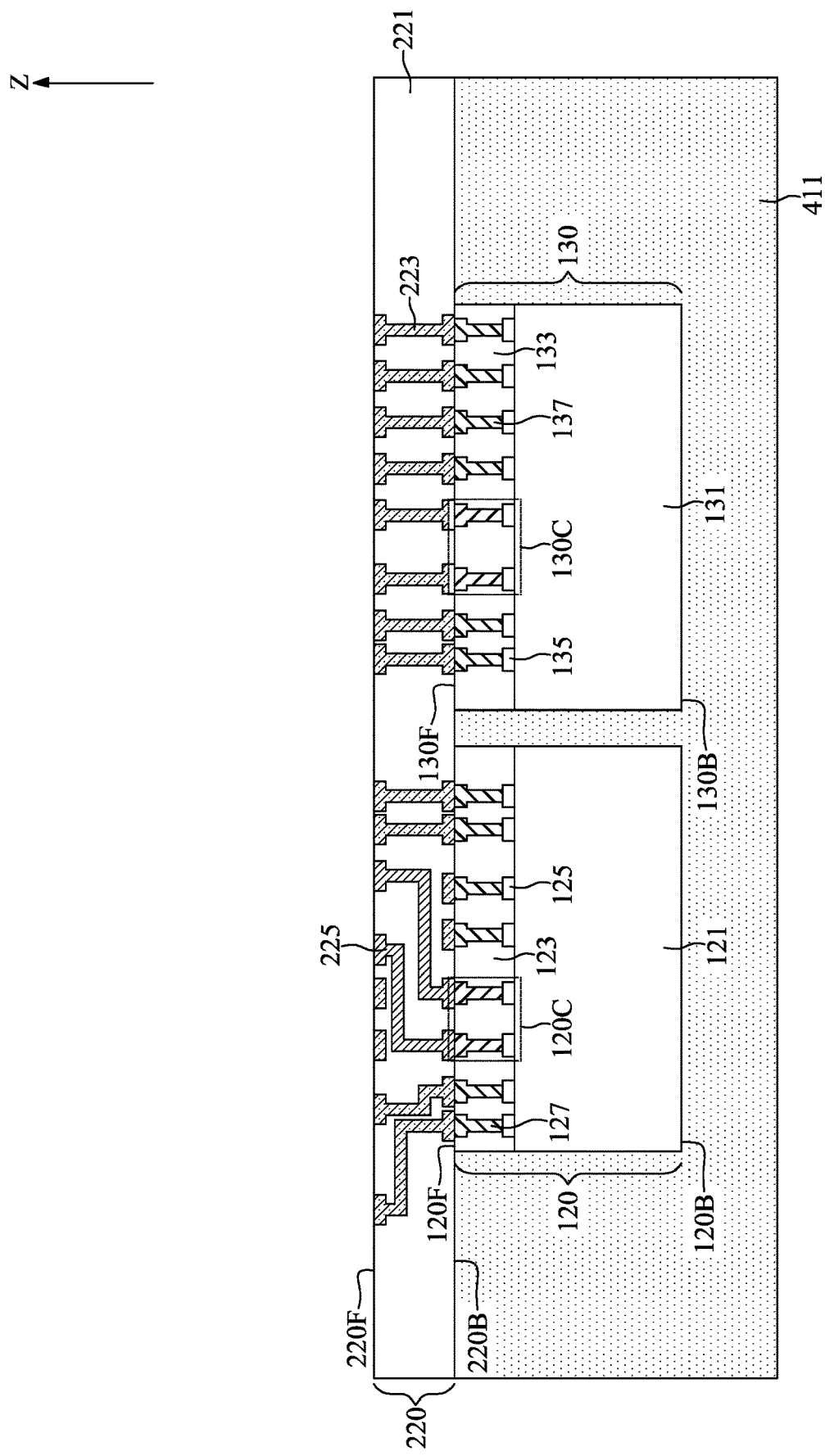
FIGS. 24 to 26 illustrate, in schematic cross-sectional view diagrams, part of a flow for fabricating a semiconductor device in accordance with another embodiment of the present disclosure.
Figure 25:
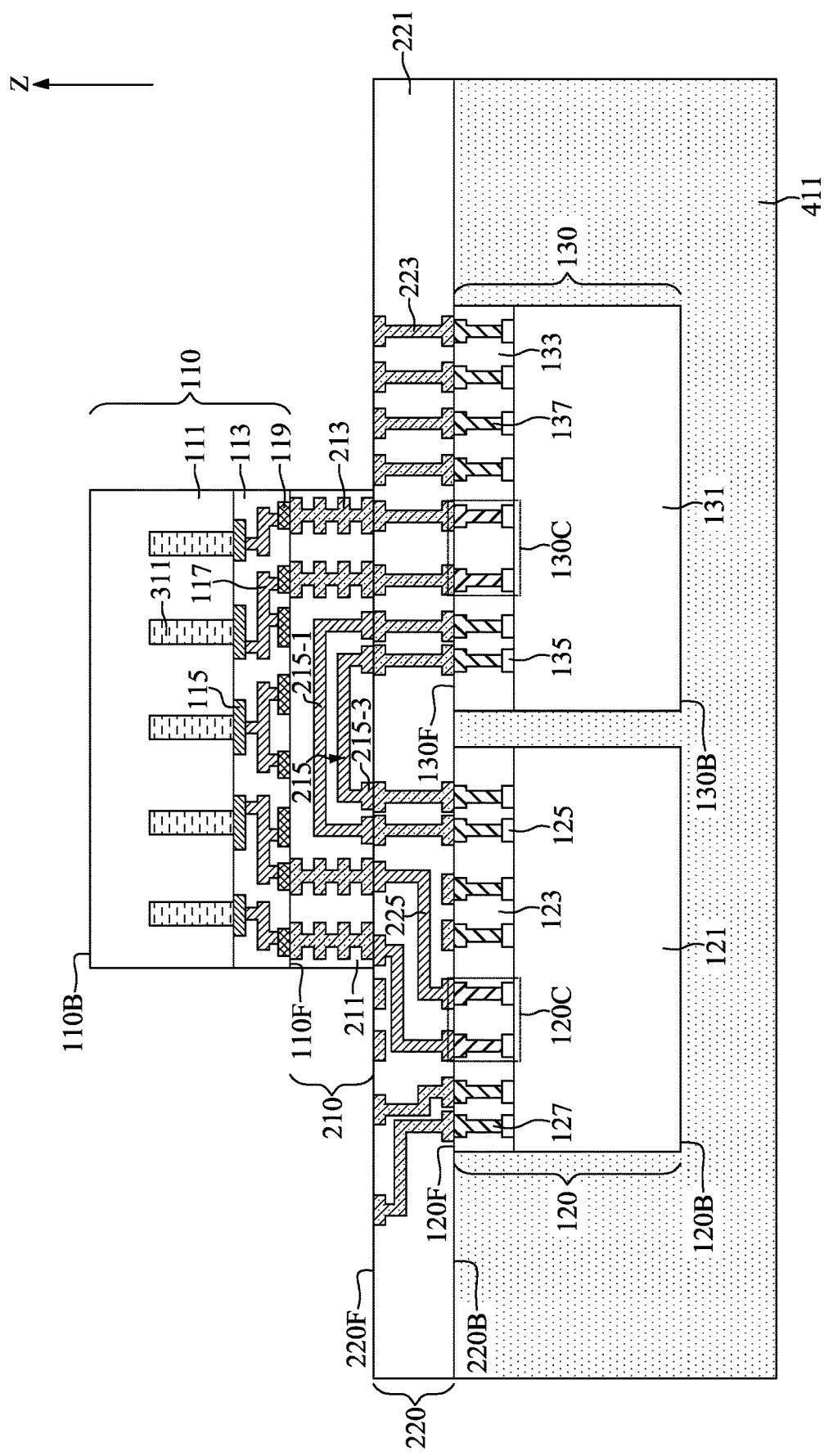
Figure 26:
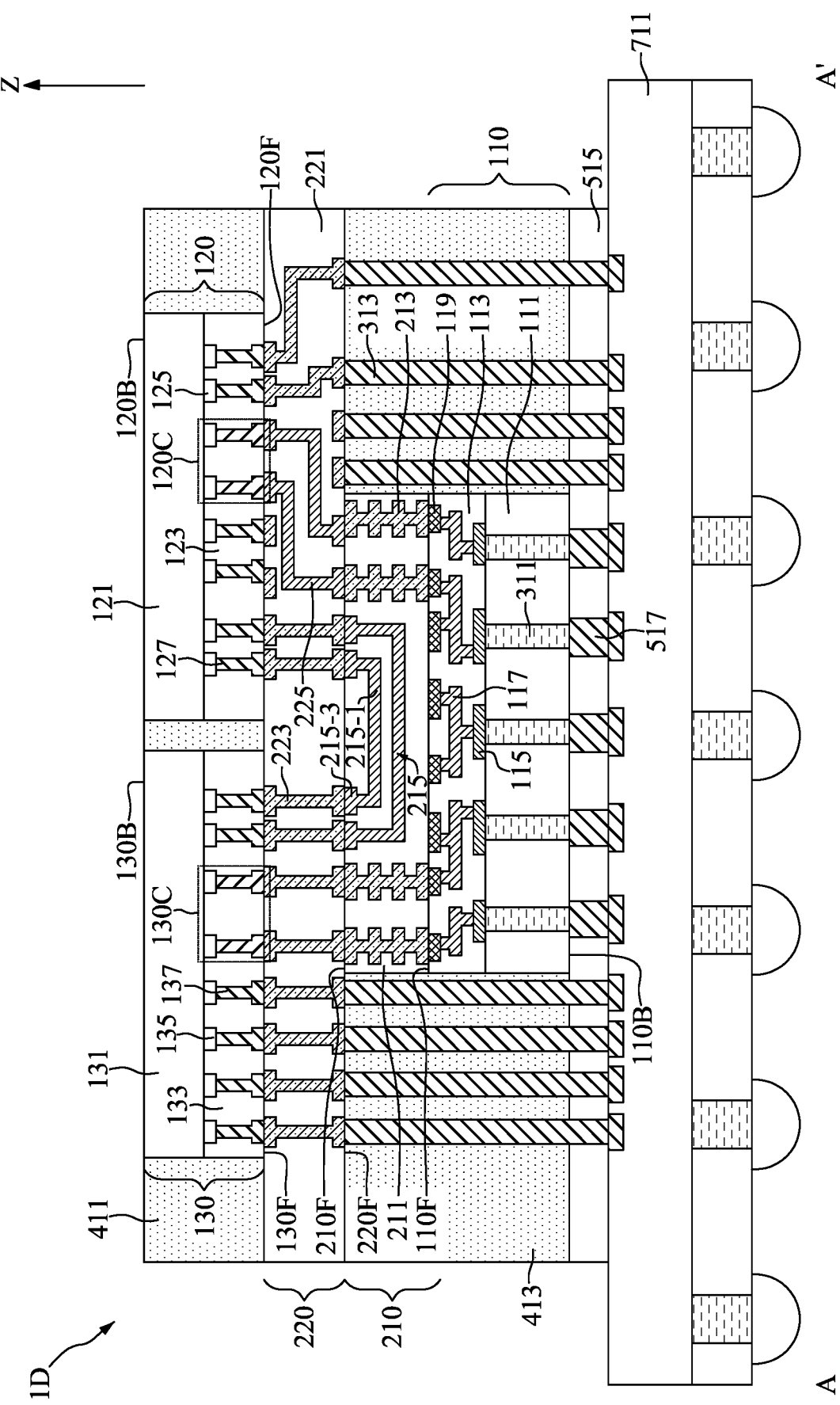

FIGS. 24 to 26 illustrate, in schematic cross-sectional view diagrams, part of a flow for fabricating a semiconductor device 1D in accordance with another embodiment of the present disclosure.

With reference to FIG. 24, an intermediate semiconductor device may be fabricated with a procedure similar to that illustrated in FIGS. 2 to 7, and descriptions thereof are not repeated herein. In the present embodiment, the layout of the second die 120 and the layout of the third die 130 may be different.

With reference to FIG. 24, a second redistribution structure 220 may be formed on the front surface 120F of the second die 120, the front surface 130F of the third die 130, and on the first molding layer 411. In some embodiments, the second redistribution structure 220 may include a second redistribution dielectric layer 221, a plurality of conductive layers 223, and a plurality of re-routing layers 225.

With reference to FIG. 24, the second redistribution dielectric layer 221 may be formed on the front surface 120F of the second die 120, on the front surface 130F of the third die 130, and on the first molding layer 411. The second redistribution dielectric layer 221 may be a stacked layer structure. The second redistribution dielectric layer 221 may include a plurality of insulating sub-layers. The insulating sub-layers may be formed of, for example, silicon oxide, borophosphosilicate glass, undoped silicate glass, fluorinated silicate glass, low-k dielectric materials, the like, or a combination thereof. The insulating sub-layers may be formed of different materials but are not limited thereto. The insulating sub-layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

In the present embodiments, the bottom surface of the second redistribution dielectric layer 221 (i.e., the surface faces toward the first molding layer 411) may be referred to as the back surface 220B of the second redistribution structure 220. Accordingly, the top surface of the second redistribution dielectric layer 221 may be referred to as the front surface 220F of the second redistribution structure 220.

With reference to FIG. 24, the plurality of second conductive layers 223 may be formed in the second redistribution dielectric layer 221. The plurality of conductive layers 223 may be formed on the plurality of second conductive layers 127 and the plurality of third conductive layers 137 to electrically couple to the functional units of the second die 120 and the third die 130. In some embodiments, the plurality of conductive layers 223 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of conductive layers 223 may be formed during the formation of the second redistribution dielectric layer 221. In some embodiments, some plurality of conductive layers 223 may be configured in a fan-out manner to increase the flexibility for subsequent via-forming process.

With reference to FIG. 3, the plurality of re-routing layers 225 may be formed in the second redistribution dielectric layer 221. In some embodiments, the plurality of re-routing layers 225 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of re-routing layers 225 may be formed during the formation of the second redistribution dielectric layer 221.

With reference to FIG. 25, the first redistribution structure 210 may be bonded onto the second redistribution structure 220 with a procedure similar to that illustrated in FIG. 9, and descriptions thereof are not repeated herein. It should be noted that, in the present embodiment, the first cache unit 120C of the second die 120 may not be topographically aligned with the first die 110. In other words, the first cache unit 120C of the second die 120 may not be covered (or overlapped) by the first die 110 in a top-view perspective. The plurality of re-routing layers 225 may be configured to electrically connect the first cache unit 120C of the second die 120 to the corresponding conductive layers 213 of the first redistribution structure 210 even if the first cache unit 120C and the first die 110 are not topographically aligned.

In some embodiments, the second cache unit 130C of the third die 130 may also not be topographically aligned with the first die 110. Other re-routing layers of the second redistribution structure 220 may be employed to electrically couple the corresponding conductive layers 213 and the second cache unit 130C of the third die 130.

With reference to FIG. 26, the plurality of through molding vias 313, the second molding layer 413, the second passivation layer 515, the plurality of second connecting layers 517, and the interposer 711 may be formed with a procedure similar to that illustrated in FIGS. to 19, and descriptions thereof are not repeated herein.

By employing the second redistribution structure 220, the flexibility of the layout of the second die 120 and the third die 130 may be increased. In other words, the difficulty of designing the second die 120 and the third die 130 may be reduced.

One aspect of the present disclosure provides a semiconductor device including a first die; a first redistribution structure positioned on the first die; a second die positioned on the first redistribution structure and comprising a first cache unit; and a third die positioned on the first redistribution structure, separated from the second die, and comprising a second cache unit. The first redistribution structure comprises: a plurality of conductive layers electrically coupled the first die and the first cache unit of the second die and electrically coupled the first die and the second cache unit of the third die, respectively and correspondingly; and a bridge layer electrically isolated from the plurality of conductive layers, electrically connected the second die and the third die. The first cache unit of the second die and the second cache unit of the third die are topographically aligned with the first die. The first die is configured as a cache memory, and the second die and the third die are configured as logic dies.

Another aspect of the present disclosure provides a semiconductor device including a first die; a second die positioned over the first die and comprising a first cache unit; a third die positioned over the first die, horizontally separated from the second die, and comprising a second cache unit; a first redistribution structure positioned between the first die and the second die, between the first die and the third die, and comprising a plurality of conductive layers electrically coupled to the first die, and a bridge layer electrically isolated from the plurality of conductive layers; and a second redistribution structure positioned between the first redistribution structure and the second die, between the first redistribution structure and the third die, and comprising a plurality of conductive layers electrically coupled the bridge layer and the second die and electrically coupled the bridge layer and the third die, and a re-routing layer electrically coupled a corresponding one of the plurality of conductive layers of the first redistribution structure and the first cache unit of the second die. The first cache unit of the second die is not topographically aligned with the first die. The first die is configured as a cache memory, and the second die and the third die are configured as logic dies.

Another aspect of the present disclosure provides a method for fabricating a semiconductor device including providing a first die comprising a front surface and a back surface; forming a first redistribution structure on the front surface of the first die; providing a second die comprising a first cache unit; providing a third die comprising a second cache unit; and bonding the second die and the third die onto a front surface of the first redistribution structure. The first redistribution structure comprises: a plurality of conductive layers electrically coupled the first die and the first cache unit of the second die and electrically coupled the first die and the second cache unit of the third die, respectively and correspondingly; and a bridge layer electrically isolated from the plurality of conductive layers, and electrically connected the second die and the third die. The first cache unit of the second die and the second cache unit of the third die are topographically aligned with the first die. The first die is configured as a cache memory, and the second die and the third die are configured as logic dies.

Due to the design of the semiconductor device of the present disclosure, the second die 120 and the third die 130 may operate cooperatively by employing the plurality of bridge layers 215. In addition, the second die 120 and the third die 130 may still respectively or cooperatively access to the first die 110. As a result, the performance of the semiconductor device 1A may be improved. Furthermore, small dies such as the first die 110, second die 120, and the third die 130 may be fabricated with higher yield compared to manufacturing of large dies. Therefore, the overall yield of manufacturing the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a first die;
a first redistribution structure positioned on the first die;
a second die positioned on the first redistribution structure and comprising a first cache unit; and
a third die positioned on the first redistribution structure, separated from the second die, and comprising a second cache unit;
wherein the first redistribution structure comprises:
a plurality of conductive layers electrically coupled the first die and the first cache unit of the second die and electrically coupled the first die and the second cache unit of the third die, respectively and correspondingly; and
a bridge layer electrically isolated from the plurality of conductive layers, electrically connected the second die and the third die;
wherein the first cache unit of the second die and the second cache unit of the third die are topographically aligned with the first die;
wherein the first die is configured as a cache memory, and the second die and the third die are configured as logic dies.

2. The semiconductor device of claim 1, further comprising a first passivation layer positioned between the second die and the first redistribution structure, and between the third die and the first redistribution structure.

3. The semiconductor device of claim 2, further comprising a first molding layer positioned on the first passivation layer and surrounding the second die and the third die, and a second molding layer positioned below the first passivation layer and surrounding the first redistribution structure and the first die.

4. The semiconductor device of claim 3, further comprising a second passivation layer positioned below the second molding layer, and an interposer positioned below the second passivation layer.

5. The semiconductor device of claim 4, further comprising a plurality of through molding vias positioned along the second molding layer and the second passivation layer to electrically couple the second die and the interposer and electrically couple the third die and the interposer, wherein the first passivation layer comprises silicon nitride, silicon oxide, silicon oxynitride, silicon nitride oxide, phosphosilicate glass, borosilicate glass, boron-doped phosphosilicate glass, polybenzoxazole, polyimide, benzocyclobutene, ajinomoto buildup film, solder resist film, or a combination thereof.

6. The semiconductor device of claim 3, wherein the first molding layer comprises polybenzoxazole, polyimide, benzocyclobutene, epoxy laminate, or ammonium bifluoride; and the plurality of conductive layers and the bridge layer of the first redistribution structure comprise tungsten, cobalt, zirconium, tantalum, titanium, aluminum, ruthenium, copper, metal carbides, metal nitrides, transition metal aluminides, or a combination thereof.

7. The semiconductor device of claim 6, further comprising a fourth die positioned on the interposer, wherein the fourth die is configured as a high bandwidth memory.

8. The semiconductor device of claim 6, further comprising a plurality of connecting units positioned between the first passivation layer and the first redistribution structure.

9. The semiconductor device of claim 8, further comprising an under-fill layer positioned between the first passivation layer and the first redistribution structure, and surrounding the plurality of connecting units, wherein the under-fill layer comprises a cross-linked organic resin and low Coefficient of Thermal Expansion inorganic particles.

10. A semiconductor device, comprising:
a first die;
a second die positioned over the first die and comprising a first cache unit;
a third die positioned over the first die, horizontally separated from the second die, and comprising a second cache unit;
a first redistribution structure positioned between the first die and the second die, between the first die and the third die, and comprising:
 a plurality of conductive layers electrically coupled to the first die; and
 a bridge layer electrically isolated from the plurality of conductive layers; and
a second redistribution structure positioned between the first redistribution structure and the second die, between the first redistribution structure and the third die, and comprising:
a plurality of conductive layers electrically coupled the bridge layer and the second die and electrically coupled the bridge layer and the third die; and
a re-routing layer electrically coupled a corresponding one of the plurality of conductive layers of the first redistribution structure and the first cache unit of the second die;
wherein the first cache unit of the second die is not topographically aligned with the first die;
wherein the first die is configured as a cache memory, and the second die and the third die are configured as logic dies.

11. The semiconductor device of claim 10, further comprising a first molding layer positioned on the second redistribution structure and surrounding the second die and the third die, and a second molding layer positioned below the second redistribution structure and surrounding the first redistribution structure and the first die.

12. The semiconductor device of claim 11, further comprising a second passivation layer positioned below the second molding layer, and an interposer positioned below the second passivation layer.

13. The semiconductor device of claim 12, further comprising a plurality of through molding vias positioned along the second molding layer and the second passivation layer.

14. The semiconductor device of claim 13, wherein the second cache unit of the third die is topographically aligned with the first die.

15. The semiconductor device of claim 13, wherein the second cache unit of the third die is not topographically aligned with the first die.

16. A method for fabricating a semiconductor device, comprising:
providing a first die comprising a front surface and a back surface;
forming a first redistribution structure on the front surface of the first die;
providing a second die comprising a first cache unit;
providing a third die comprising a second cache unit; and
bonding the second die and the third die onto a front surface of the first redistribution structure;
wherein the first redistribution structure comprises:
a plurality of conductive layers electrically coupled the first die and the first cache unit of the second die and electrically coupled the first die and the second cache unit of the third die, respectively and correspondingly; and
a bridge layer electrically isolated from the plurality of conductive layers, and electrically connected the second die and the third die;
wherein the first cache unit of the second die and the second cache unit of the third die are topographically aligned with the first die;
wherein the first die is configured as a cache memory, and the second die and the third die are configured as logic dies.

17. The method for fabricating the semiconductor device of claim 16, further comprising bonding the back surface of the first die onto an interposer, wherein bonding the second die and the third die onto the front surface of the first redistribution structure is performed by a hybrid bonding process.

18. The method for fabricating the semiconductor device of claim 17, further comprising forming a first passivation layer between the first redistribution structure and the second die, and between the first redistribution structure and the third die, wherein the first passivation layer comprises silicon nitride, silicon oxide, silicon oxynitride, silicon nitride oxide, phosphosilicate glass, borosilicate glass, boron-doped phosphosilicate glass, polybenzoxazole, polyimide, benzocyclobutene, ajinomoto buildup film, solder resist film, or a combination thereof.

19. The method for fabricating the semiconductor device of claim 18, further comprising forming a first molding layer covering the second die and the third die, wherein the first molding layer comprises polybenzoxazole, polyimide, benzocyclobutene, epoxy laminate, or ammonium bifluoride.

20. The method for fabricating the semiconductor device of claim 19, wherein the plurality of conductive layers and the bridge layer of the first redistribution structure comprise tungsten, cobalt, zirconium, tantalum, titanium, aluminum, ruthenium, copper, metal carbides, metal nitrides, transition metal aluminides, or a combination thereof.

\* \* \* \* \*